United States Patent
Dutta et al.

(10) Patent No.: US 7,876,611 B2
(45) Date of Patent: Jan. 25, 2011

(54) COMPENSATING FOR COUPLING DURING READ OPERATIONS IN NON-VOLATILE STORAGE

(75) Inventors: Deepanshu Dutta, Santa Clara, CA (US); Jeffrey W. Lutze, San Jose, CA (US); Yingda Dong, San Jose, CA (US); Henry Chin, Palo Alto, CA (US); Toru Ishigaki, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 242 days.

(21) Appl. No.: 12/188,629

(22) Filed: Aug. 8, 2008

(65) Prior Publication Data

US 2010/0034022 A1 Feb. 11, 2010

(51) Int. Cl.
*G11C 11/34* (2006.01)

(52) U.S. Cl. ............... 365/185.02; 365/185.2; 365/238.5

(58) Field of Classification Search ............ 365/185.02, 365/185.2, 238.5, 185.11, 185.18, 189.05, 365/185.03, 185.25, 185.22
See application file for complete search history.

(56) References Cited

U.S. PATENT DOCUMENTS

| | | | |
|---|---|---|---|
| 5,867,429 A | 2/1999 | Chen | |
| 5,912,838 A | 6/1999 | Chevallier | |
| 6,097,633 A | 8/2000 | La Placa | |
| 6,456,557 B1 | 9/2002 | Dadashev | |
| 6,522,580 B2 | 2/2003 | Chen | |
| 6,542,407 B1 | 4/2003 | Chen | |
| 6,859,397 B2 | 2/2005 | Lutze | |
| 6,870,770 B2 | 3/2005 | Roohparvar | |
| 6,917,542 B2 | 7/2005 | Chen | |
| 6,956,770 B2 | 10/2005 | Khalid | |
| 6,999,344 B2 | 2/2006 | Hosono | |
| 7,120,051 B2 | 10/2006 | Gorobets | |
| 7,177,199 B2 | 2/2007 | Chen | |
| 7,187,585 B2 * | 3/2007 | Li et al. ............... 365/185.2 |
| 7,193,898 B2 | 3/2007 | Cernea | |
| 7,196,928 B2 | 3/2007 | Chen | |
| 7,372,730 B2 | 5/2008 | Chen | |
| 2005/0162913 A1 | 7/2005 | Chen | |
| 2006/0285391 A1 | 12/2006 | Cernea | |
| 2007/0133288 A1 * | 6/2007 | Iwai et al. ............ 365/185.17 |
| 2007/0153583 A1 * | 7/2007 | Guterman ............ 365/185.23 |
| 2008/0158973 A1 | 7/2008 | Mui | |
| 2009/0016103 A1 * | 1/2009 | Kang et al. ............ 365/185.03 |

* cited by examiner

OTHER PUBLICATIONS

PCT International Search Report and Written Opinion of the International Searching Authority dated Oct. 21, 2009, PCT Patent Appl. PCT/US2009/050974.

*Primary Examiner*—Dang T Nguyen
(74) *Attorney, Agent, or Firm*—Vierra Magen Marous & DeNiro LLP

(57) ABSTRACT

Capacitive coupling from storage elements on adjacent bit lines is compensated by adjusting voltages applied to the adjacent bit lines. An initial rough read is performed to ascertain the data states of the bit line-adjacent storage elements, and during a subsequent fine read, bit line voltages are set based on the ascertained states and the current control gate read voltage which is applied to a selected word line. When the current control gate read voltage corresponds to a lower data state than the ascertained state of an adjacent storage element, a compensating bit line voltage is used. Compensation of coupling from a storage element on an adjacent word line can also be provided by applying different read pass voltages to the adjacent word line, and obtaining read data using a particular read pass voltage which is identified based on a data state of the word line-adjacent storage element.

25 Claims, 19 Drawing Sheets

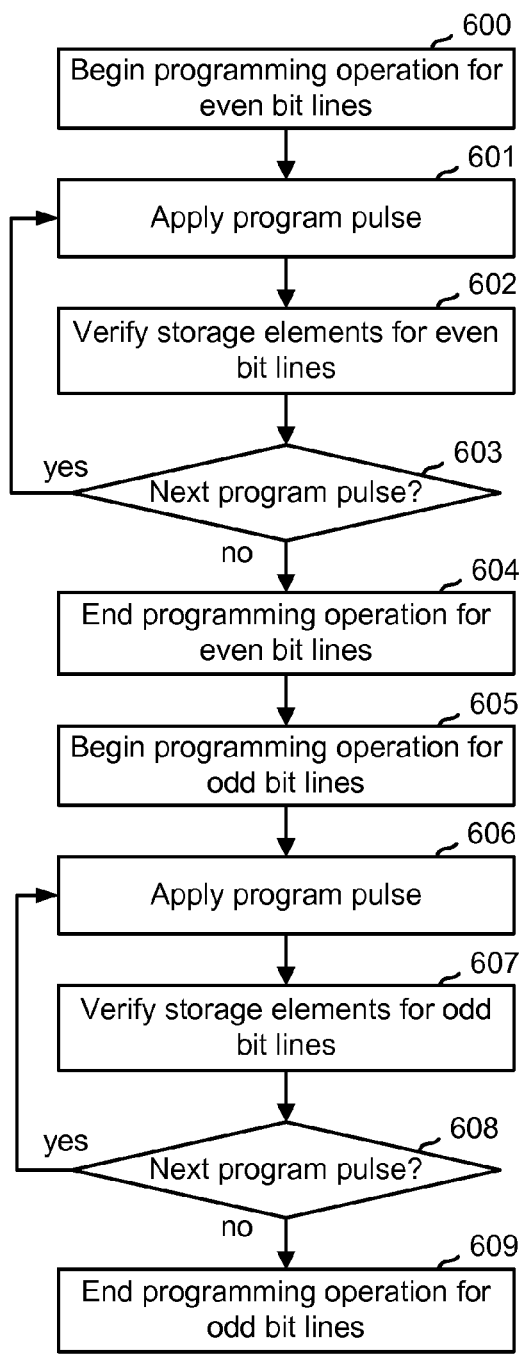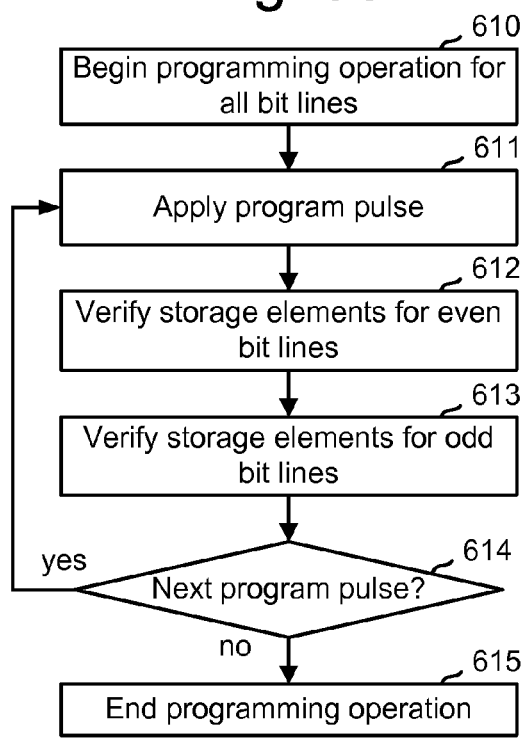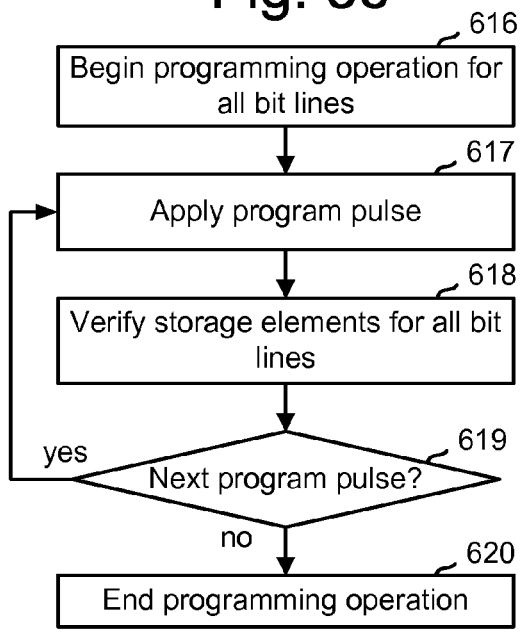

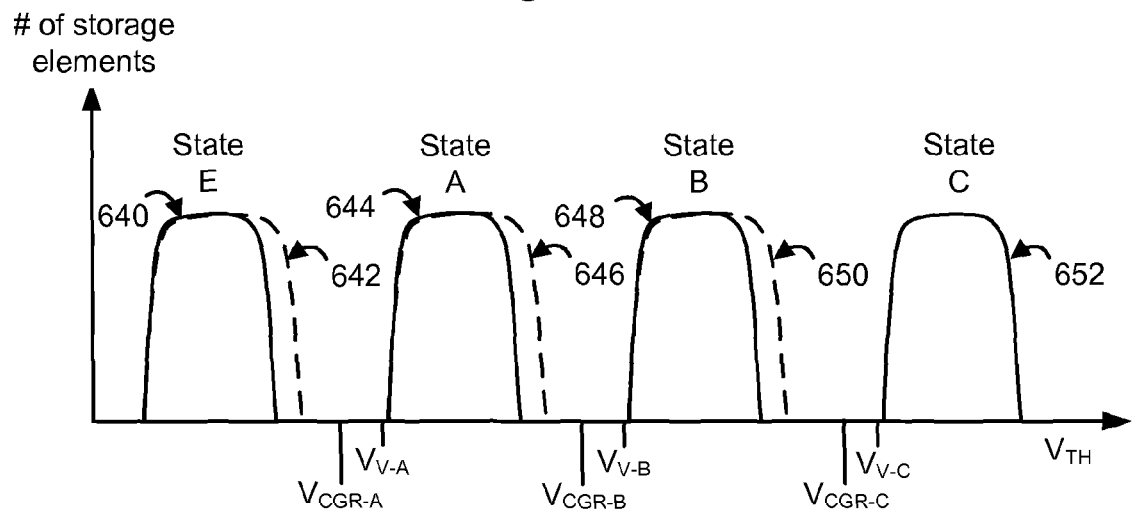
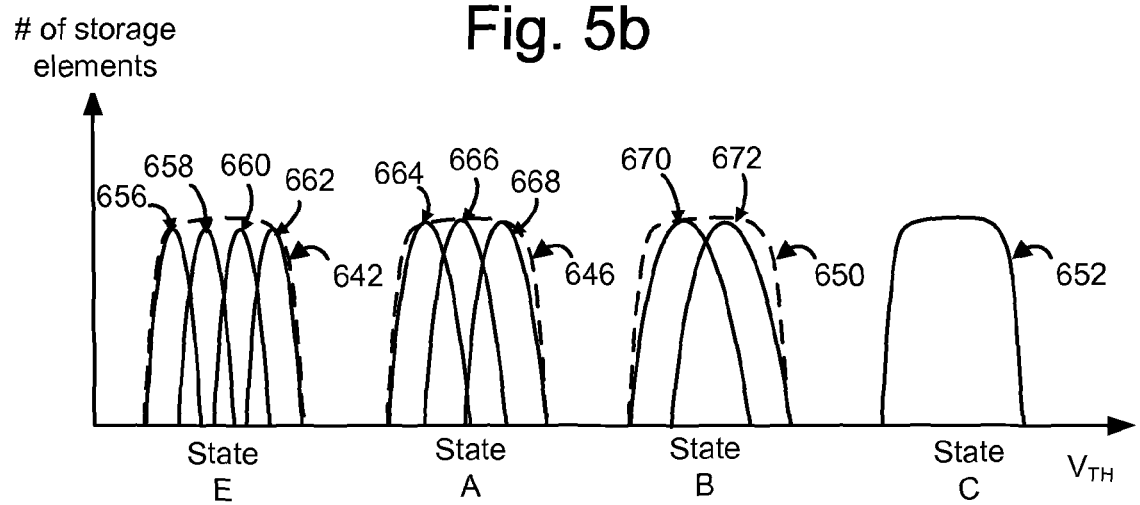

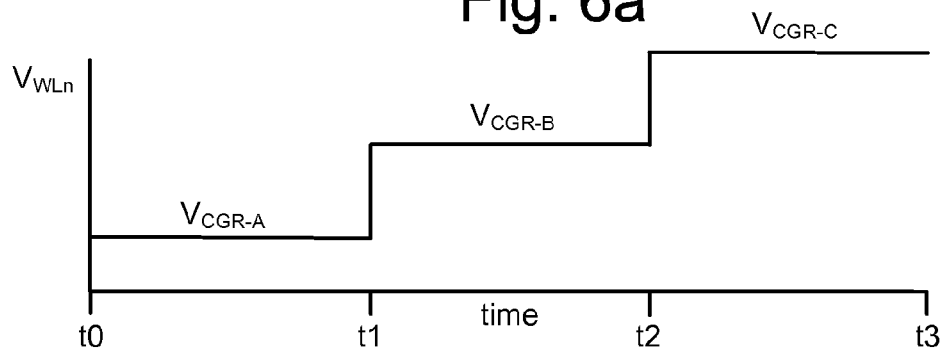
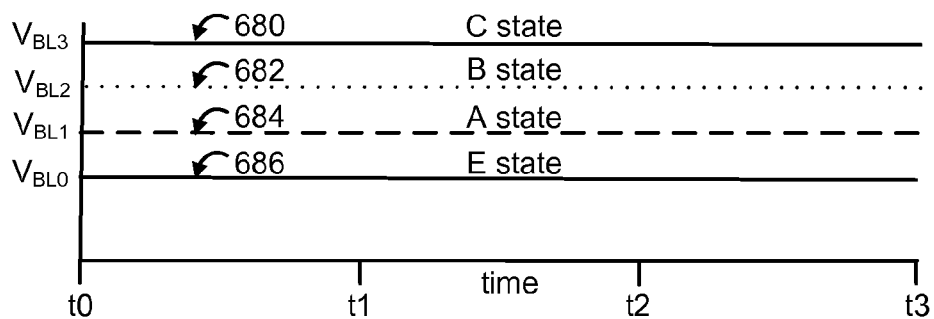
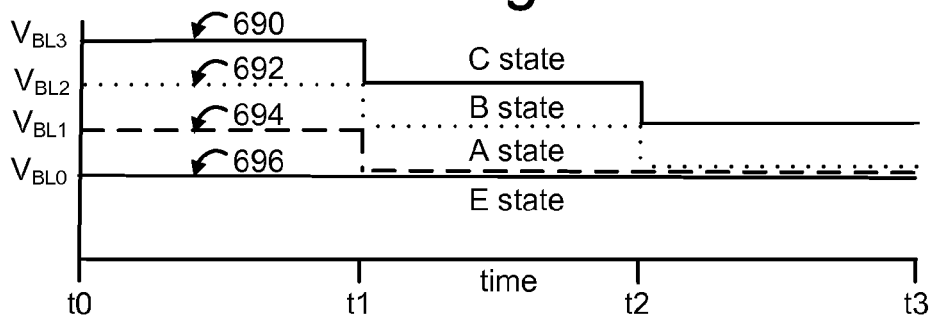
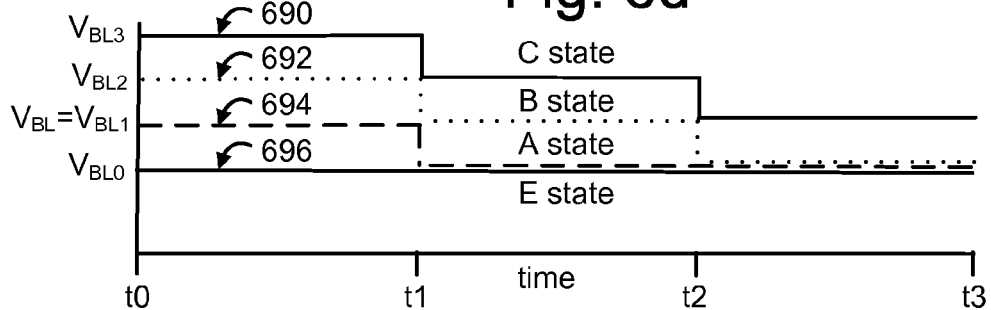

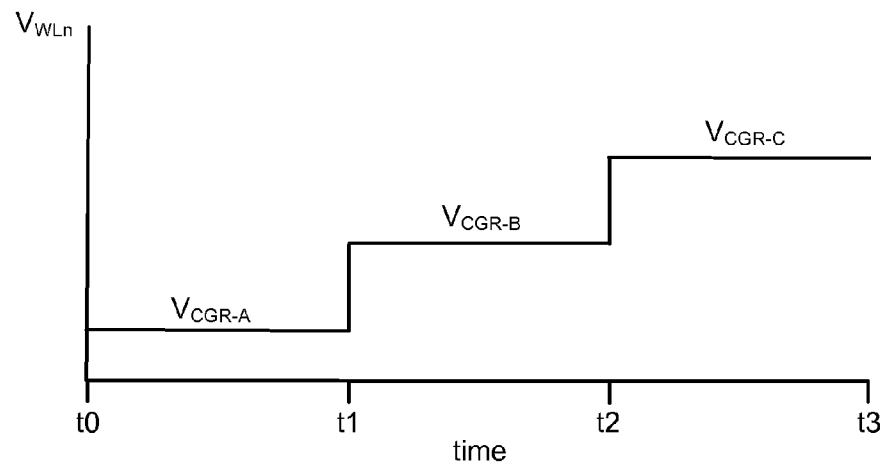
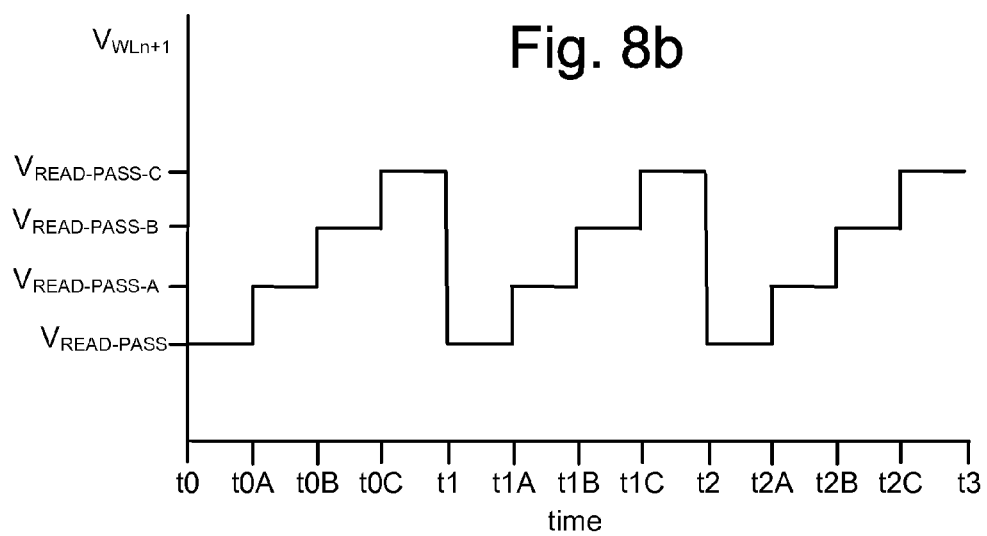

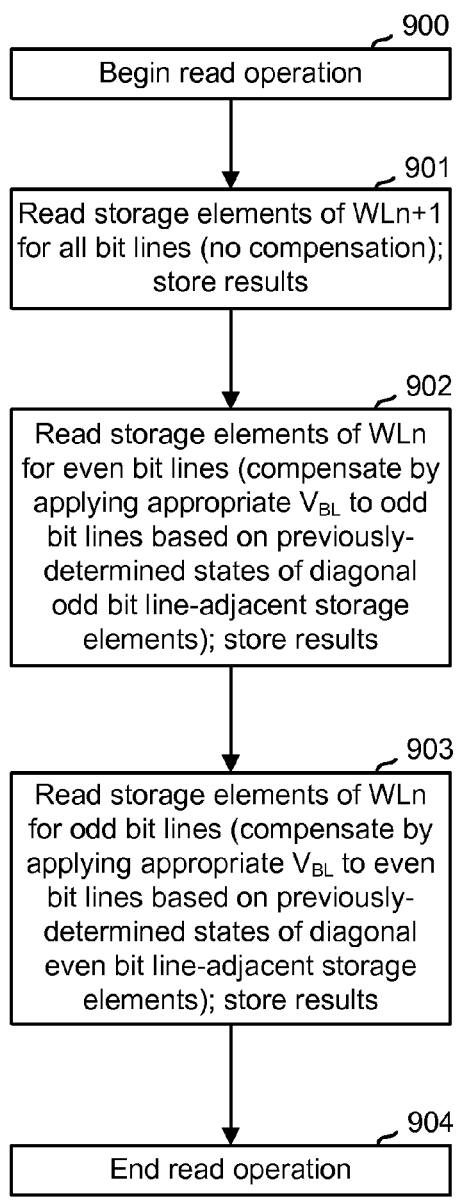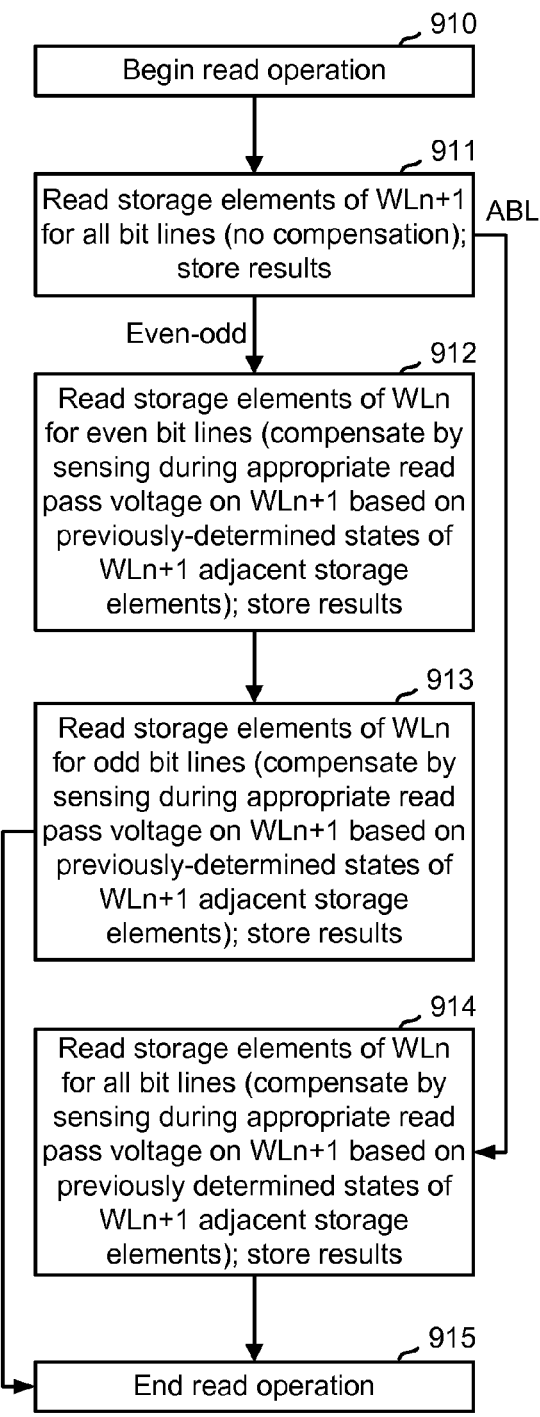
Fig. 9a
Fig. 9b

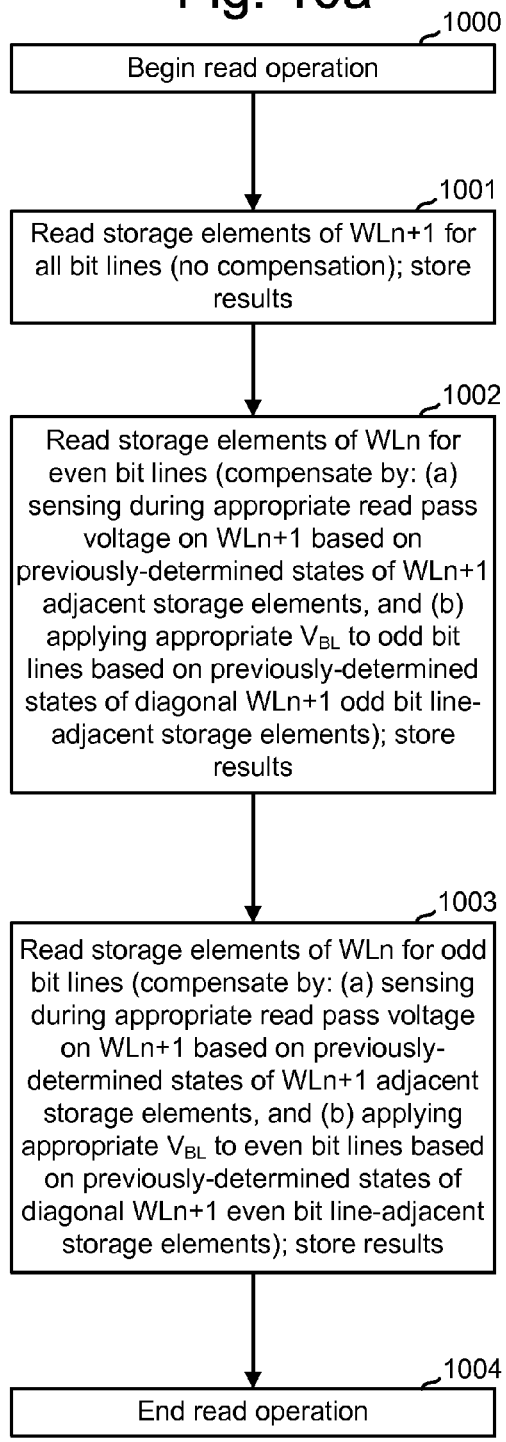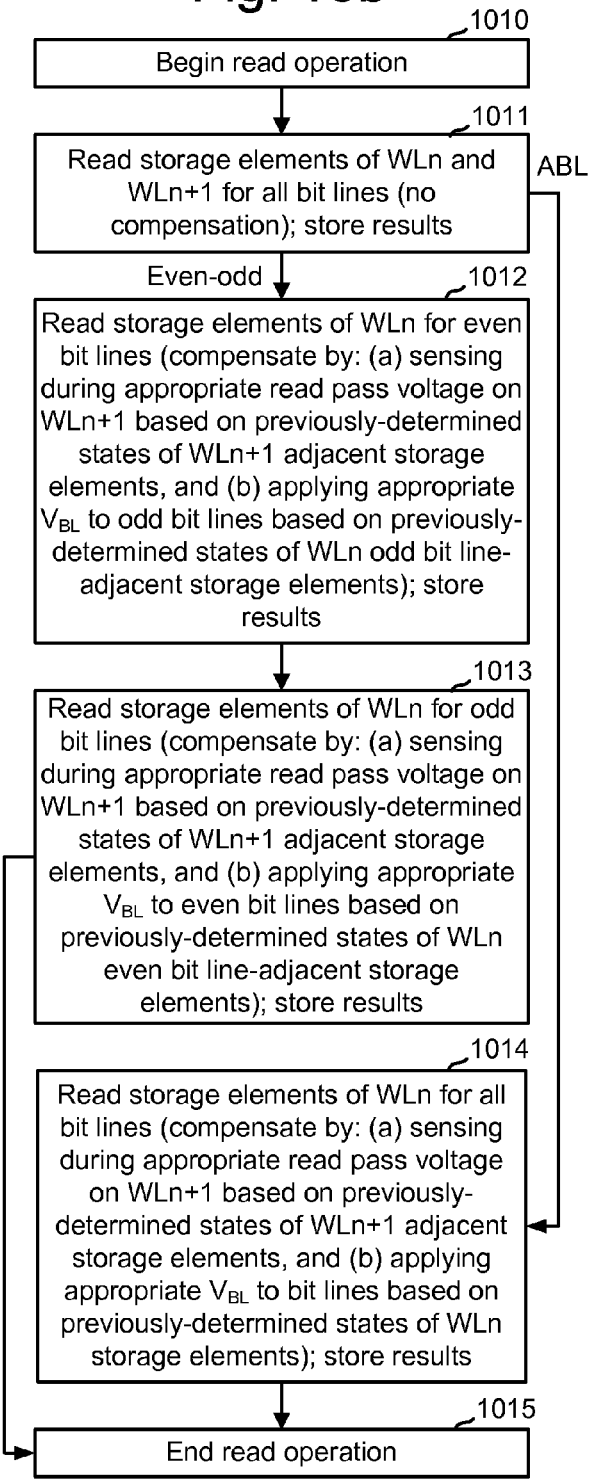

COMPENSATING FOR COUPLING DURING READ OPERATIONS IN NON-VOLATILE STORAGE

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM. Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

One issue which continues to be problematic is read accuracy. The read process must be accurate so that data can be read back with high fidelity. For example, multi-level devices which place threshold voltage ranges close together leave little room for error. Inaccuracies in reading a selected storage element can be caused by many variables, including the programmed data states of other, unselected storage elements which cause capacitive coupling. Accordingly, techniques which improved read accuracy are needed.

SUMMARY OF THE INVENTION

The present invention addresses the above and other issues by providing a method for improving read accuracy in non-volatile storage by compensating for capacitive coupling.

In one embodiment, a method for operating non-volatile storage includes reading at least one bit line-adjacent storage element of a selected storage element to ascertain a data state of the at least one bit line-adjacent storage element. The at least one bit line-adjacent storage element and the selected storage element are associated with respective bit lines. The method further includes reading the selected storage element to ascertain a data state of the selected storage element, including applying different control gate read voltages, one at a time, to the selected storage element while setting voltages of the respective bit line of the at least one bit line-adjacent storage element based on its ascertained data state and the control gate read voltages.

In another embodiment, a method for operating non-volatile storage includes, as part of a first step of a multi-step read operation, reading storage elements to ascertain their data states. The storage elements are associated with a plurality of adjacent bit lines. The method further includes, as part of a second step of the multi-step read operation, again reading the storage elements to again ascertain their data states, including applying different control gate read voltages, one after another, to the storage elements, and setting voltages on the bit lines based on the ascertained data states of the first step and based on the control gate read voltages.

In another embodiment, a method for operating non-volatile storage includes reading storage elements on an adjacent word line of a selected word line to ascertain their data states, including reading a word-line adjacent storage element of a selected storage element associated with the selected word line, and reading at least one bit line-adjacent storage element of the selected storage element. The method further includes reading the selected storage element to ascertain its data state, while compensating for coupling associated with the word line-adjacent storage element, responsive to the reading of the word line-adjacent storage element, and while compensating for coupling associated with the at least one bit line-adjacent storage element, responsive to the reading of the at least one bit line-adjacent storage element.

In another embodiment, a non-volatile storage includes a set of storage elements and at least one control circuit. The at least one control circuit reads at least one bit line-adjacent storage element of a selected storage element to ascertain a data state of the at least one bit line-adjacent storage element. The at least one bit line-adjacent storage element and the selected storage element are associated with respective bit lines. The at least one control circuit further reads the selected storage element to ascertain a data state of the selected storage element, including applying different control gate read voltages, one at a time, to the selected storage element while setting voltages of the respective bit line of the at least one bit line-adjacent storage element based on its ascertained data state and the control gate read voltages.

Corresponding methods, systems and computer- or processor-readable storage devices for performing the methods provided herein may also be provided.

BRIEF DESCRIPTION OF THE DRAWINGS

FIG. 1b is an equivalent circuit diagram of the NAND string of FIG. 1a.

FIG. 3a depicts a programming technique corresponding to FIG. 2d.

FIG. 3b depicts a programming technique corresponding to FIG. 2e.

FIG. 3c depicts a programming technique corresponding to FIG. 2f.

FIG. 5a depicts a threshold voltage distribution with and without coupling.

FIG. 5b depicts details of a threshold voltage distribution with coupling.

FIG. 6a depicts control gate read voltages applied to a selected word line during a read operation.

FIG. 6b depicts bit line voltages applied to odd bit line storage elements when reading even bit line storage elements, after programming corresponding to FIG. 2d.

FIG. 6c depicts bit line voltages applied to storage elements based on their states and based on a control gate read voltage, after programming corresponding to FIG. 2e.

FIG. 6d depicts bit line voltages applied to storage elements based on their states and based on a control gate read voltage, after programming corresponding to FIG. 2f.

FIG. 8a depicts control gate read voltages applied to a selected word line during a read operation.

FIG. 8b depicts control gate read pass voltages applied to an adjacent word line during a read operation.

FIG. 9a depicts a read operation which includes compensation for diagonally bit line-adjacent storage elements.

FIG. 9b depicts a read operation which includes compensation for a word line-adjacent storage element.

FIG. 10a depicts a read operation which includes compensation for diagonally bit line-adjacent storage elements, and a word line-adjacent storage element.

FIG. 10b depicts a read operation which includes compensation for same-word line, bit line-adjacent storage elements, and a word line-adjacent storage element.

DETAILED DESCRIPTION

The present invention provides a method for improving read accuracy in non-volatile storage by compensating for capacitive coupling.

Figure 1A:
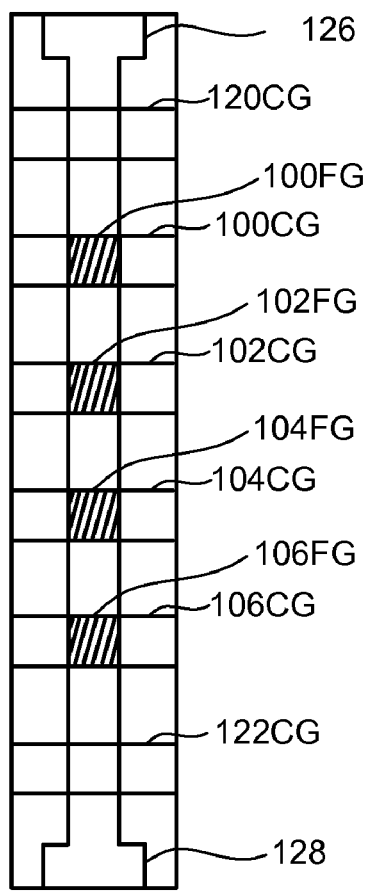
FIG. 1a is a top view of a NAND string.
Figure 1B:
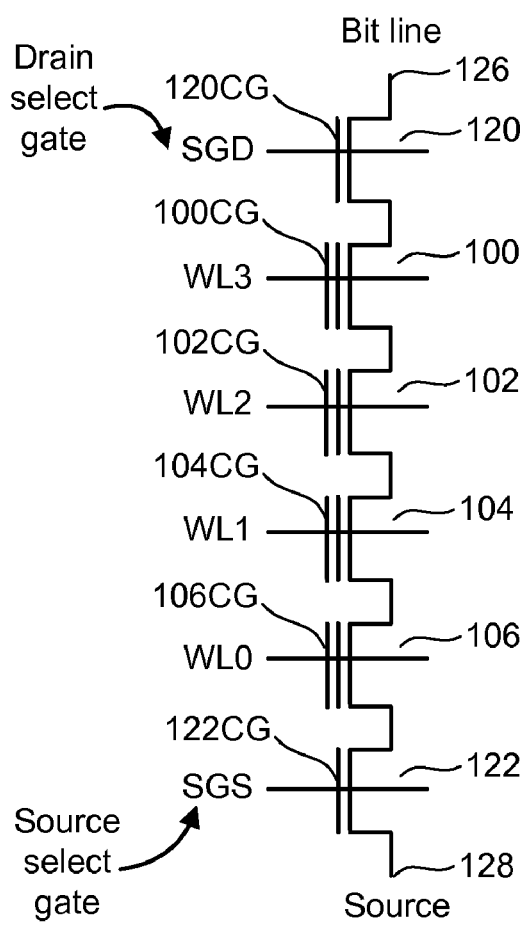

One example of a memory system suitable for implementing the present invention uses the NAND flash memory structure, which includes connecting multiple transistors in series between two select gates. The transistors connected in series and the select gates are referred to as a NAND string. FIG. 1a is a top view showing one NAND string. FIG. 1b is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 1C:
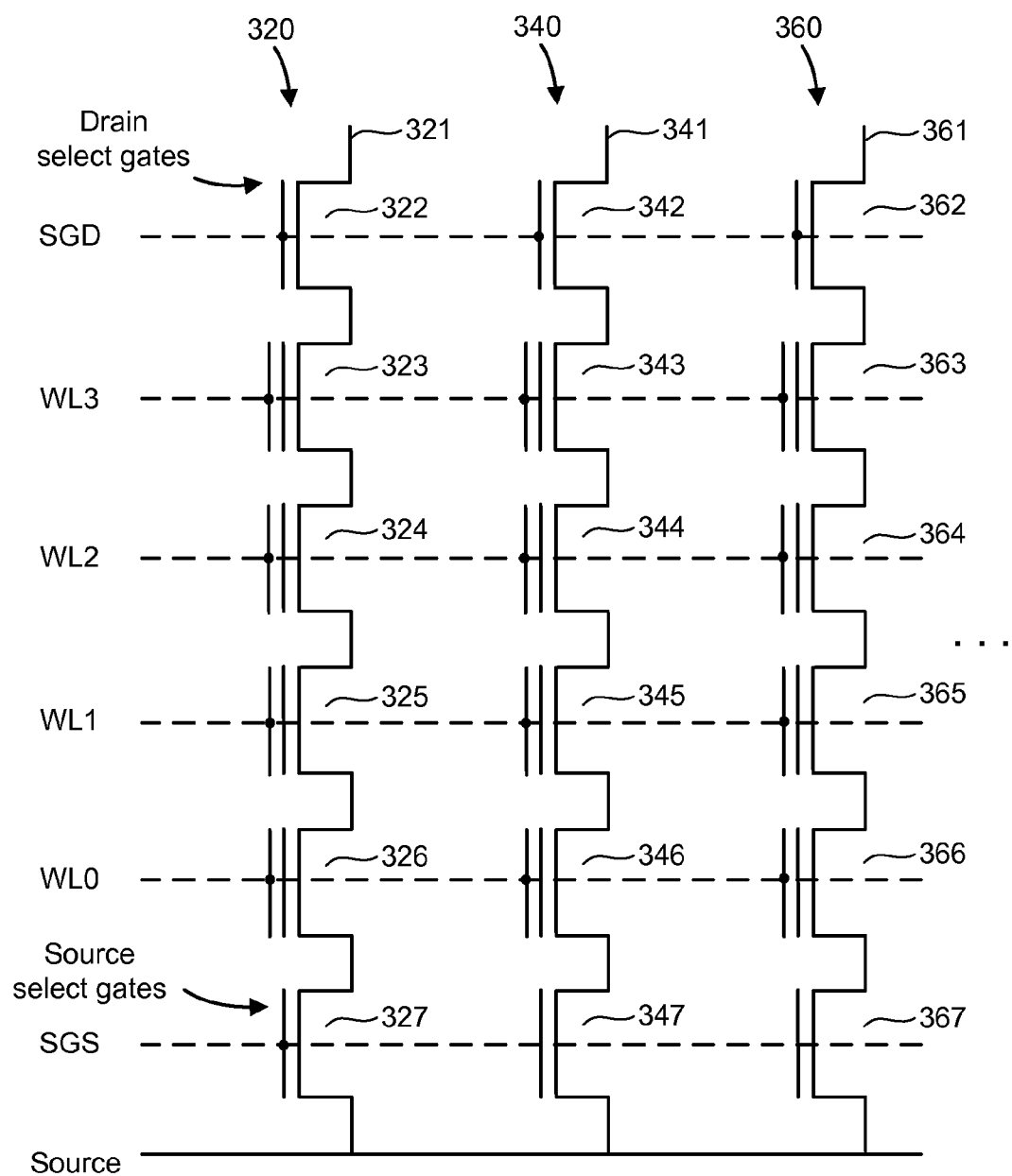
FIG. 1c is a block diagram of an array of NAND flash storage elements.

FIG. 1c is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 1c, the program voltage will also be applied to the control gates of storage elements 344 and 364.

Figure 2A:
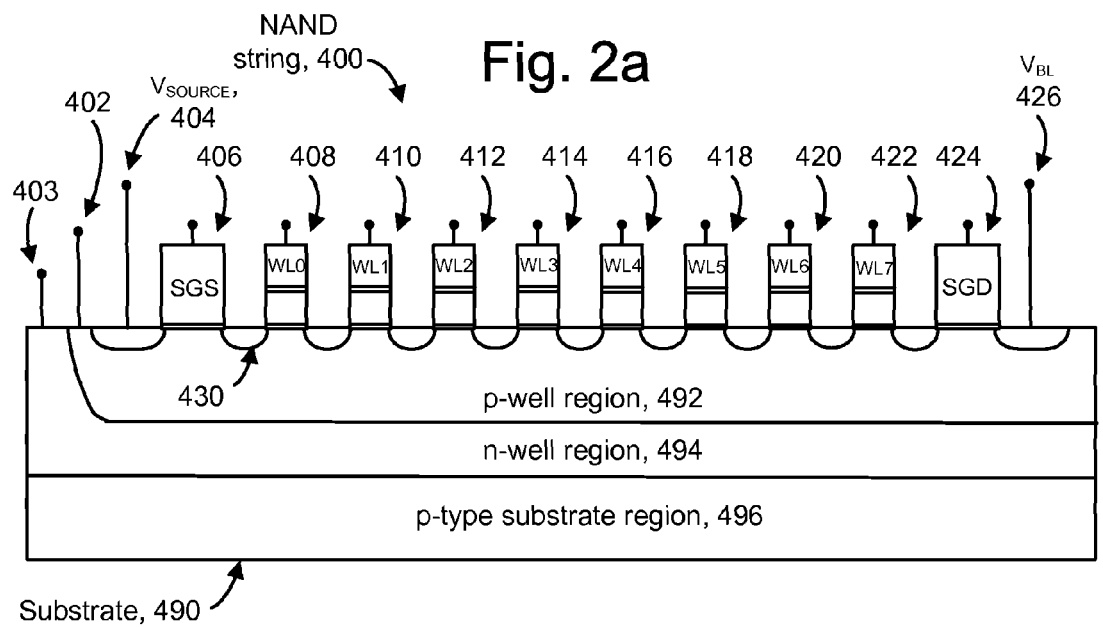
FIG. 2a depicts a cross-sectional view of a NAND string.

FIG. 2a depicts a cross-sectional view of a NAND string. The view is simplified and not to scale. The NAND string 400 includes a source-side select gate 406, a drain-side select gate 424, and eight storage elements 408, 410, 412, 414, 416, 418, 420 and 422, formed on a substrate 490. The components can be formed on a p-well region 492 which itself is formed in an n-well region 494 of the substrate. The n-well can in turn be formed in a p-substrate 496. Supply lines 402 and 403 may communicate with the p-well region 492 and n-well region 494, respectively. A source supply line 404 with a potential of $V_{SOURCE}$ is provided in addition to a bit line 426 with a potential of $V_{BL}$. $V_{SGS}$ is applied to the select gate 406 and $V_{SGD}$ is applied to the select gate 424. The source side of a word line or non-volatile storage element refers to the side which faces the source end of the NAND string, e.g., at source supply line 404, while the drain side of a word line or non-volatile storage element refers to the side which faces the drain end of the NAND string, e.g., at bit line 426. In one approach, programming proceeds word line-by-word line, starting at WL0.

Figure 2B:
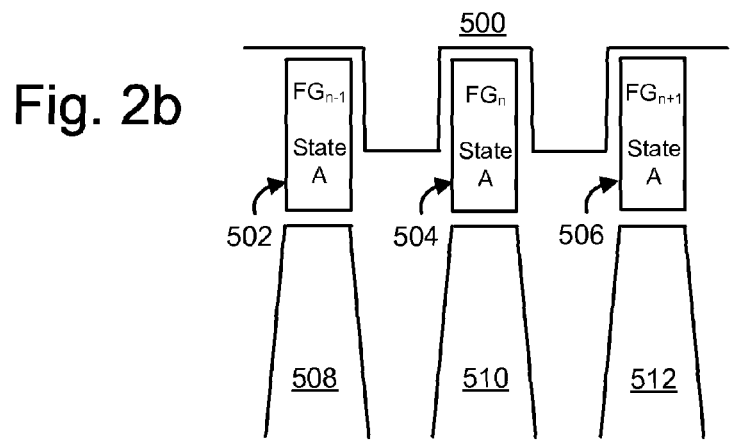
FIG. 2b depicts a cross-sectional view in a word line direction of storage elements during programming.
Figure 2C:
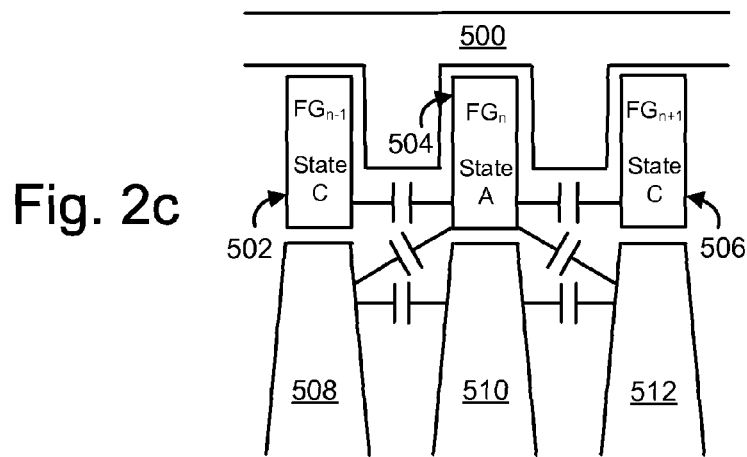
FIG. 2c depicts a cross-sectional view in a word line direction of storage elements after programming is completed, including capacitive coupling effects for one storage element.

FIG. 2b depicts a cross-sectional view in a word line direction of storage elements during programming. Channel regions 508, 510 and 512 are depicted with associated floating gates FGn−1 502, FGn 504 and FGn+1 506. A word line 500 extends above and between the floating gates. In a typical programming sequence, such as described in connection with FIGS. 2d-2f, the program voltage Vpgm applied to the word line 500 is increased pulse by pulse, so that the threshold voltage $V_{TH}$ of the storage elements increases until the storage element is verified and locked out. When data is programmed on a word line in a NAND block, for instance, different storage elements can be programmed to different $V_{TH}$ states. For example, in all bit line programming, a storage element on NAND chain-n (or connected with a bit line BLn) can be programmed to the A-state while its bit line-adjacent neighbor storage elements, which are associated with BLn−1 or BLn+1, can be programmed to a higher state, such as the C-state. This example assumes there are four states: the erased state E and programmed states A, B and C. In multi-level memory devices, $2^N$ states are used, where $N \geq 2$. For example, four, eight or sixteen states may be used. In such a scenario, when we program verify the storage element on BLn to state A and lock it out, its neighbors were at the same state (state A) or a lower state (state E) when it is locked out. However, after further programming and completion of the programming of the neighbor storage elements to state C, for instance, as depicted in FIG. 2c, the $V_{TH}$ of the neighbor storage elements has increased to the higher C state. This change in the data state of the neighbors between the time a selected storage element completes programming and the time it is subsequently read, results in capacitive coupling to the selected storage element.

FIG. 2c depicts a cross-sectional view in a word line direction of storage elements after programming is completed, including capacitive coupling effects for one storage element. After the programming operation is completed, when the storage element 504 is read back later, its $V_{TH}$ appears to be higher than when it was initially programmed. This is a result of capacitive coupling from the neighboring floating gates FGn+1 and FGn−1 which makes the $V_{TH}$ of FGn appear higher. This is called a bit line-to-bit line interference or coupling effect. Various types of capacitive coupling can occur, including coupling between floating gates, between channels, and between a channel and a floating gate, as depicted. Due mainly to the floating gate-to-floating gate coupling, when the neighbor to a selected storage element which is being read has a higher $V_{TH}$ (higher data state) than the selected storage element, the $V_{TH}$ of the selected storage element will appear relatively higher. Similarly, if the neighbor has a lower $V_{TH}$ (lower data state) than the selected storage element, the $V_{TH}$ of the selected storage element will appear relatively lower, and almost the same as the $V_{TH}$ at which it was verified and locked out when it completed programming. These variations in $V_{TH}$ make the overall distribution much wider and reduce failure margins (including over-programming and data-retention margins) due to the increased likelihood of read failures.

Generally, when data is programmed randomly, the storage elements can have any combination of data states. Some storage elements will have high $V_{TH}$ neighbors while some will have low $V_{TH}$ neighbors. For example, an A-state storage element that has high $V_{TH}$ neighbors (such as B-state or C-state neighbors) will appear higher in $V_{TH}$ as compare to an A-state storage element that has low $V_{TH}$ neighbors (such as E-state or A-state neighbors). Capacitive coupling effects can be compensated, partially or completely, using a variety of techniques discussed herein. Such techniques can advantageously lead to tighter threshold voltage distributions.

Note that the effects of coupling vary according to the programming techniques. To illustrate, three programming techniques are discussed below. Other programming techniques are also possible. A first possible programming technique is even-odd programming which involves program and verify the storage elements of the even- and odd-numbered bit lines separately. See FIG. 2d, which depicts an example pulse train applied to the control gates of non-volatile storage elements, and FIG. 3a which depicts a corresponding programming method. The pulse train includes a first portion 520 which is used for programming and verifying even bit line storage elements, followed by a second portion 540, which is used for programming and verifying odd bit line storage elements. The first portion 520 includes a number of program pulses 522, 524, 526, 528, 530 . . . and a set of verify pulses (one example of which is verify pulse set 523) between each pair of program pulses for verifying the even bit line storage elements. The second portion 540 includes a number of program pulses 542, 544, 546, 548, 550 . . . and a set of verify pulses (one example of which is verify pulse set 543) between each pair of program pulses for verifying the odd bit line storage elements.

In one embodiment, the programming pulses have a voltage, $V_{PGM}$, which starts at 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. The verify pulses in each set can have amplitudes of $V_{V-A}$, $V_{V-B}$ and $V_{V-C}$, such as depicted in FIG. 5a, for instance.

This programming approach can involve a first stage of programming and verifying storage elements of the even-numbered bit lines (e.g., even-numbered storage elements) until they have reached intended states, then a second stage of programming and verifying storage elements of the odd-numbered bit lines (e.g., odd-numbered storage elements) until they have reached intended states. In this case, the even-numbered storage elements finish first, after which programming of the odd-numbered storage elements starts. The odd-numbered storage elements do not receive BL-to-BL coupling because they are programmed last. Only the even-numbered storage elements receive BL-to-BL coupling (from the odd-numbered storage elements) because additional programming which causes the coupling occurs after the even-numbered storage elements are programmed. So, compensation is needed only for the even-numbered storage elements. Specifically, when the even-numbered storage elements finish programming, the odd-numbered storage elements will be all at the E-state. When the odd-numbered storage elements subsequently are programmed, the even-numbered storage elements receive the full coupling effect from the increasing $V_{TH}$ of the odd-numbered storage elements.

Moreover, the amount of coupling experienced by the even-numbered storage elements depends on the states of the bit line-adjacent storage elements, but is generally independent of the states of the even-numbered storage elements. In other words, the amount of coupling experienced by a given even-numbered storage element does not depend on a difference between the state of the given even-numbered storage element and the states of the adjacent storage elements. For example, an even-numbered storage element in state E, A, B or C receives the same amount of interference from an adjacent odd-numbered storage element in a given state. So, all even-numbered storage elements receive the same coupling $C_A$ from an adjacent odd-numbered storage element in the A-state. Likewise, all even-numbered storage elements receive the same coupling $C_B$ from an adjacent odd-numbered storage element in the B-state, and all even-numbered storage elements receive the same coupling $C_C$ from an adjacent odd-numbered storage element in the B-state, where $C_C > C_B > C_A$.

Referring to FIG. 3a, this programming technique begins with a programming operation for even bit lines at step 600. At step 601, a program pulse is applied to a selected word line. At step 602, even bit line storage elements are verified. At step 603, if there is a next program pulse, the process continues at step 601. If there are no further program pulses to apply, the programming operation for the even bit lines ends at step 604. At step 605, the programming technique continues with a programming operation for odd bit lines. At step 606, a program pulse is applied to the selected word line. At step 607, odd bit line storage elements are verified. At step 608, if there is a next program pulse, the process continues at step 606. If there are no further program pulses to apply, the programming operation for the odd bit lines ends at step 609.

A second possible programming technique involves applying program pulses to storage elements of all bit lines together, and performing a verify operation separately for the storage elements of the even- and odd-numbered bit lines. This is an all bit line programming, even verify, odd verify approach. See FIG. 2e, which depicts an example pulse train applied to the control gates of non-volatile storage elements in an all BL program, even verify, odd verify approach, and FIG. 3b which depicts a corresponding programming method.

The pulse train 560 includes a number of program pulses 562, 564, 566, 568, 570 . . . , and two sets of verify pulses between each pair of program pulses. One set of verify pulses (one example of which is verify pulse set 561) is used for verifying even BL storage elements, and another set of verify pulses (one example of which is verify pulse set 563) is used for verifying odd BL storage elements. In this case, the programming pulses are applied to all bit lines concurrently but the verify pulses are applied separately for the even- and odd-numbered bit lines. For example, after one program pulse is applied, a set of verify voltages is applied to the even-numbered bit lines, then a set of verify voltages is applied to the odd-numbered bit lines, then the process repeats with the next program pulse. Referring to FIG. 3b, this programming technique begins with a programming operation for all bit lines at step 610. At step 611, a program pulse is applied to a selected word line. At step 612, even bit line storage elements are verified. At step 613, odd bit line storage elements are verified. At step 614, if there is a next program pulse, the process continues at step 611. If there are no further program pulses to apply, the programming operation ends at step 615.

A third possible programming technique involves all bit line programming and verifying, where the storage elements of all bit lines on a selected word line are programmed and verified together. This is an all bit line program, all bit line verify approach. See FIG. 2f, which depicts an example pulse train applied to the control gates of non-volatile storage elements in this technique, and FIG. 3c, which depicts a corresponding programming method. The pulse train 580 includes a number of program pulses 582, 584, 586, 588, 590 . . . , and one set of verify pulses (one example of which is verify pulse set 583) between each pair of program pulses. Each set of verify pulses is used for verifying all BL storage elements. Here, the storage elements of both even- and odd-numbered bit lines finish programming together. In this case, a storage element in a given state experiences BL-to-BL interference only from bit line-adjacent storage elements which are in a higher state. For example, an A-state storage element experiences interference from adjacent storage elements if they are in the B- and/or C-state, but not in the E- and/or A-state. A B-state storage element experiences interference from adjacent storage elements if they are in the C-state, but not in the E-, A- and/or B-states. A C-state storage element does not experience interference from adjacent storage elements.

Referring to FIG. 3c, this programming technique begins with a programming operation for all bit lines at step 616. At step 617, a program pulse is applied to a selected word line. At step 618, all storage elements are verified. At step 619, if there is a next program pulse, the process continues at step 617. If there are no further program pulses to apply, the programming operation ends at step 620.

In addition to the different programming techniques, different corresponding read techniques can be used including all bit line read, in which all bit lines are read at the same time, and even-odd read, in which the even bit lines are read before the odd bit lines. Specific read and compensation techniques are detailed further below.

Figure 4A:
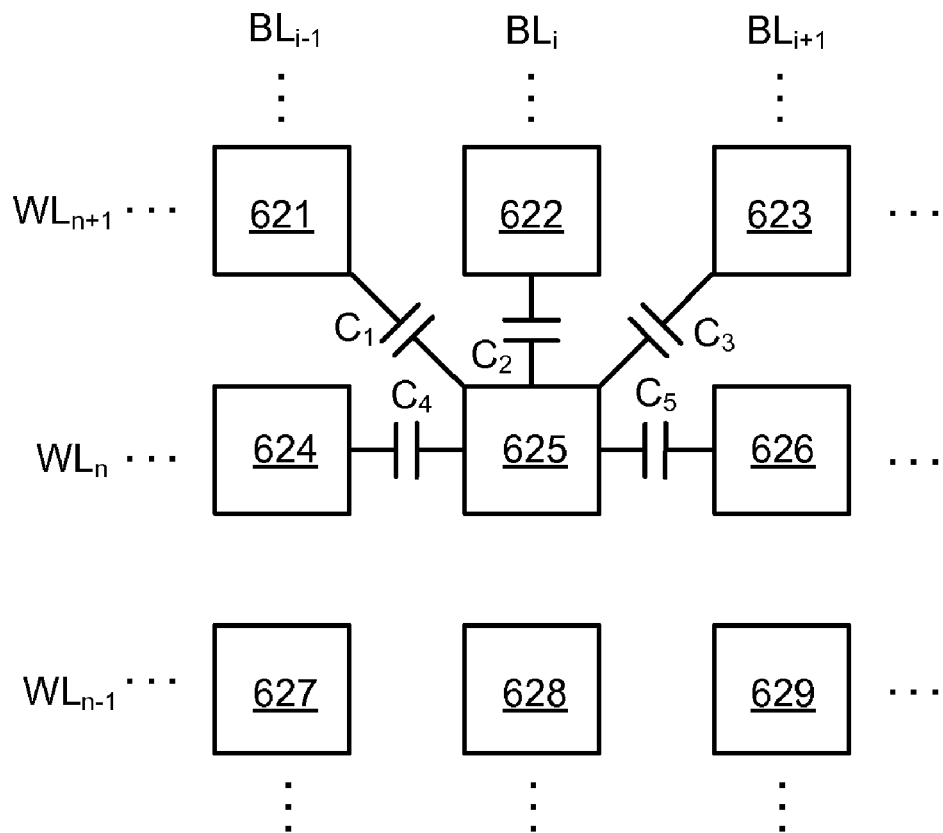
FIG. 4a depicts capacitive coupling effects for one storage element from neighboring storage elements.

FIG. 4a depicts capacitive coupling effects for one storage element from neighboring storage elements. While FIG. 2c depicted coupling from adjacent storage elements on the same word line, coupling can also occur due to storage elements on an adjacent world line. For example, word lines WLn−1, WLn and WLn+1 are depicted as a subset of all word lines in a block or other set of storage elements, and bit lines BLi−1, BLi and BLi+1 are depicted as a subset of all bit lines in the set. Typically, coupling is a function of the distance between storage elements, so that primary effects are due to the adjacent storage elements. For example, consider the coupling experienced by storage element 625. Storage elements 624 and 626 on WLn are bit line-adjacent to storage element 625 because they are on adjacent bit lines as the selected storage element 625. Storage elements 621 and 623 are also bit line-adjacent to storage element 625, diagonally on the adjacent word line WLn+1. Storage element 622 is word line-adjacent to storage element 625, on WLn+1. The coupling experienced by storage element 625 due to the storage elements 621, 622, 623, 624 and 626 is $C_1$, $C_2$, $C_3$, $C_4$ and $C_5$, respectively.

In this example, the word line programming order may be: WLn−1, WLn and WLn+1. Generally, coupling is mainly due to storage elements on the same word line or on the adjacent word line WLn+1, which is programmed after WLn, than from storage elements on WLn−1 which is programmed before WLn. This is true because the storage elements on WLn−1 have the same data state between when the storage elements on WLn have completed programming and when they are read. Thus, capacitive coupling from storage elements 627, 628 and 629 on WLn−1 is not depicted. In contrast, some of the storage elements on WLn or WLn+1 will have different data states between when the storage elements on WLn have completed programmed and when they are read. However, it is possible for the storage element to experience coupling from Wn−1 in some situations.

Various approaches to compensating for coupling include programming techniques which use multiple passes so that the $V_{TH}$ of the storage elements is raised gradually, and programming schemes in which programming of the higher states is completed before programming of lower states. With these approaches, typically the BL-BL coupling is reduced or compensated only on the programmed states. Thus, the erased state (E-state) is not compensated. Compensating the BL-BL interference on the E-state will be more important on future generation devices in which the E-state is wider and occupies a larger part of the $V_{TH}$ window. The techniques provided herein at least partially compensate BL-BL interference on the E-state as well as other states. Further, the techniques are adaptable to different memory device types, including non-volatile devices such as NAND and NOR, and to different storage element dimensions. The overall performance impact can be smaller as compared to previous approaches.

Figure 4B:
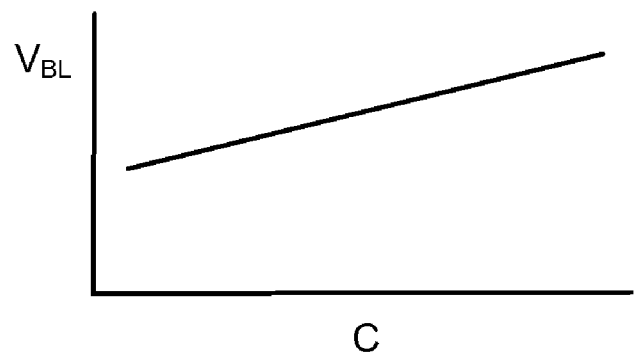
FIG. 4b depicts a bit line voltage adjustment to offset capacitive coupling.

FIG. 4b depicts a bit line voltage adjustment to offset capacitive coupling. One approach involves adjusting bit line voltage ($V_{BL}$) in proportion to the amount of coupling (C), so that $V_{BL}$ is higher for a neighbor storage element which has a relatively higher $V_{TH}$ than a selected storage element being read. A higher $V_{BL}$ results in a higher channel potential for the neighbor storage element which is coupled to the floating gate and the channel of the selected storage element, e.g., FGn, making its $V_{TH}$ appear lower, thus compensating for the coupling interference which otherwise makes the $V_{TH}$ appear higher. $V_{BL}$ is expressed as a function of a coupling magnitude. The adjusted $V_{BL}$ can be applied during a read operation as detailed further below.

FIG. 5a depicts a threshold voltage distribution with and without coupling. As mentioned, coupling effects cause the apparent $V_{TH}$ of a given storage element to increase. Over a set of storage elements, the collective $V_{TH}$ distribution for each state will also increase, as depicted by the $V_{TH}$ distributions 640, 644, 648 and 652 for states E, A, B and C, respectively, without coupling, e.g., just after programming, and the $V_{TH}$ distributions 642, 646 and 650 for states E, A and B, respectively, with coupling, such as with the all bit line programming technique of FIG. 2f. The highest state, state C, will experience little or no coupling in this example. Moreover, each $V_{TH}$ distribution includes components based on the coupling, as shown in FIG. 4b. The control gate read voltages $V_{CGR-A}$, $V_{CGR-B}$ and $V_{CGR-C}$ for states A, B and C, respectively, are used during a read operation to ascertain the data state of one or more selected storage elements. The control gate verify voltages $V_{V-A}$, $V_{V-B}$ and $V_{V-C}$ for states A, B and C, respectively, are used during the verify portion of a program-verify operation to verify whether one or more selected storage elements have been programmed to an intended state.

FIG. 5b depicts details of a threshold voltage distribution with coupling. For the storage elements in state E, there will be essentially little or no coupling from neighboring storage elements which are also in state E, as indicated by distribution component 656. However, storage elements in state E will have their $V_{TH}$ coupled higher by neighboring storage elements which are in state A, state B and state C as indicated by distribution components 658, 660 and 662, respectively. The overall E state distribution 642 is thus comprised of the distribution component 656, 658, 660 and 662. Similarly, for the storage elements in state A, there will be essentially little or no coupling from neighboring storage elements which are in state E or A, as indicated by distribution component 664. However, storage elements in state A will have their $V_{TH}$ coupled higher by neighboring storage elements which are in state B and state C as indicated by distribution components 666 and 668, respectively. Similarly, for the storage elements in state B, there will be essentially little or no coupling from neighboring storage elements which are in state E, A or B, as indicated by distribution component 670. However, storage elements in state B will have their $V_{TH}$ coupled higher by neighboring storage elements which are in state C as indicated by distribution component 672. For the storage elements in state C, there will be essentially little or no coupling from other neighboring storage elements which are in state E, A, B or C, as indicated by distribution component 652.

FIG. 6a depicts control gate read voltages applied to a selected word line during a read operation. During a read operation, a control gate voltage waveform having successive amplitudes $V_{CGR-A}$, $V_{CGR-B}$ and $V_{CGR-C}$ for states A, B and C, respectively, is applied to the word line of one or more selected storage elements which are being read in time periods t0-t1, t1-t2 and t2-t3, respectively. $V_{CGR-A}$, $V_{CGR-B}$ and $V_{CGR-C}$ are also depicted in FIG. 5a. This example applies to the case where there are four available data states. Generally, the control gate voltage waveform will have $2^N-1$ amplitudes when there are $2^N$ possible data states. To further illustrate an example compensation technique, consider the E, A, B and C states to be states 0, 1, 2 and 3, respectively. Consider also that $V_{CGR-A}$, $V_{CGR-B}$ and $V_{CGR-C}$ represent read levels 1, 2 and 3, respectively. Moreover, four different bit line voltages $V_{BL0} < V_{BL1} < V_{BL2} < V_{BL3}$ are available. If the control gate voltage is at the mth read level (m=1, 2 or 3) and the neighboring storage element is at nth (n=0, 1, 2 or 3) state, then, if m>n, use $V_{BL0}$ on the bit line of the neighboring storage element to offset its coupling. If m=<n, use $V_{BLn+1-m}$ on the bit line of the neighboring storage element to offset its coupling. Table 1 provides further details.

TABLE 1

| m | n | $V_{BL}$ |
|---|---|---|
| 1 ($V_{CGR-A}$) | 0 (E) | $V_{BL0}$ |
|  | 1 (A) | $V_{BL1}$ |
|  | 2 (B) | $V_{BL2}$ |
|  | 3 (C) | $V_{BL3}$ |

TABLE 1-continued

| m | n | $V_{BL}$ |
|---|---|---|
| 2 ($V_{CGR-B}$) | 0 (E) | $V_{BL0}$ |
|  | 1 (A) | $V_{BL0}$ |
|  | 2 (B) | $V_{BL1}$ |
|  | 3 (C) | $V_{BL2}$ |
| 3 ($V_{CGR-C}$) | 0 (E) | $V_{BL0}$ |
|  | 1 (A) | $V_{BL0}$ |
|  | 2 (B) | $V_{BL0}$ |
|  | 3 (C) | $V_{BL1}$ |

Note that a given storage element will usually have two bit line-adjacent neighboring storage elements on the same word line, in which case the above bit line voltages can be applied to the respective bit lines of these neighbors when the given storage elements is being read. For example, when an adjacent storage element on BLi+1 has been programmed to the B-state (n=2), and the other adjacent storage element on BLi−1 has been programmed to the C-state (n=3), then we can set $V_{BL2}$ on BLi+1 and $V_{BL3}$ on BLi−1 during the period t0-t1, $V_{BL1}$ on BLi+1 and $V_{BL2}$ on BLi−1 during the period t1-t2, and $V_{BL0}$ on BLi+1 and $V_{BL1}$ on BLi−1 during the period t2-t3. Compensating bit line voltages for other combinations of states for the adjacent storage element can similarly be provided. Moreover, the compensation of the bit line is changed as the control gate read voltage changes so that the compensation is always at an optimal level.

It is also possible to compensate for the coupling of two storage elements on one bit line, e.g., BLi−1 or BLi+1. In this case, a voltage is applied to the bit line which compensates for the total coupling amount from the two storage elements. It is also possible to compensate additionally for the coupling of a word line-adjacent storage element as discussed further below, so that compensation is provided for up to five storage elements. For example, when reading storage element 625 in FIG. 4a, compensation can be provided for the five storage elements 621, 622, 623, 624 and 626. In this case, both bit line-to-bit line and word line-to-word line coupling effects are compensated.

Thus, if a storage element which is not being read is in a higher state than the state which is associated with the current read level, then a higher $V_{BL}$ voltage is used for this storage element. This higher $V_{BL}$ boosts the potential of the floating gate and the channel of the associated unselected storage element. This potential gets coupled to the channel and the floating gate of the selected storage element and hence makes its $V_{TH}$ appear to be lower, since the coupled potential helps to turn on (make conductive) the selected storage element. Thus, a selected storage element which has a neighboring storage element at a higher $V_{TH}$ state will appear to be lower in $V_{TH}$. This downshift in $V_{TH}$ compensates for the up shift in $V_{TH}$ that the selected storage element received due to BL-BL interference. For a lower $V_{TH}$ neighbor, a lower $V_{BL}$ is used, which means much less or no downshift in $V_{TH}$ of the selected storage element. Hence, overall the total $V_{TH}$ distribution will become tighter.

Figure 2D:
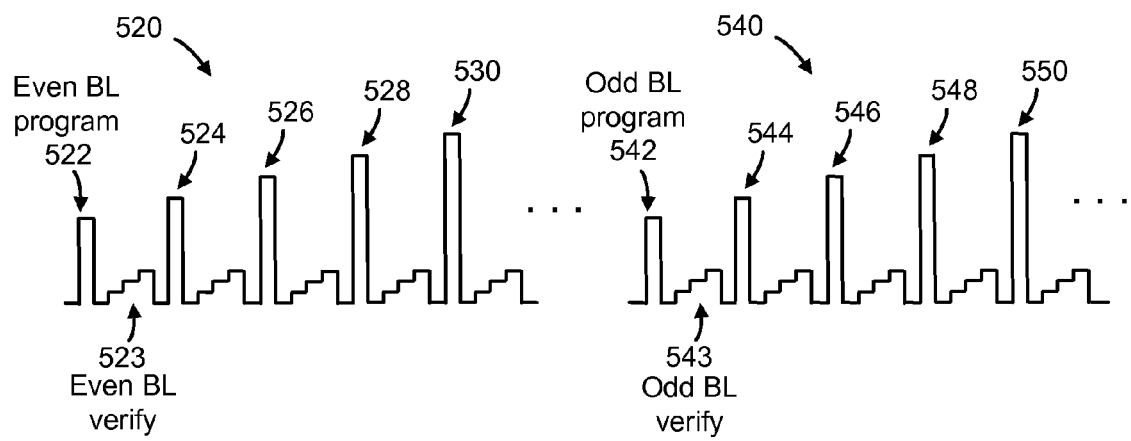
FIG. 2d depicts an example pulse train applied to the control gates of non-volatile storage elements in an even bit line program-verify, odd bit line program-verify programming technique.

FIG. 6b depicts bit line voltages applied to odd bit line storage elements when reading even bit line storage elements, after programming corresponding to FIG. 2d. The time axis is the same as in FIG. 6a. They y-axis depicts $V_{BL}$ which is applied to an unselected storage element. During an odd-even read operation, storage elements associated with odd bit lines are read separately from storage elements associated with even bit lines. Thus, we are relatively free to adjust the bit line voltages of the unselected storage elements. For example, when the even-numbered bit line storage elements are being read, we are relatively free to adjust the bit line voltages of the odd-numbered bit line storage elements. As mentioned previously, the odd-numbered storage elements are typically programmed after the even-numbered storage elements and therefore do not experience coupling. As a result, they do require compensation during a read operation. Thus, in one approach, fixed bit line voltages are applied to the odd- and even-odd-numbered storage elements when reading the odd-numbered storage elements, and variable bit line voltages as depicted in FIG. 6b are applied to the odd-numbered storage elements when reading the even-numbered storage elements. Moreover the odd storage elements may be read first so that their states are know and appropriate compensation can be applied to them when subsequently reading the even storage elements. The control of the memory device can be configured with the appropriate intelligence for carrying out the techniques discussed herein.

Waveforms 680, 682, 684 and 686 depict the voltage which is applied to an unselected storage element for all control gate read voltages. Specifically, for an even storage element, the bit line of a bit line-adjacent storage element receives $V_{BL0}$, $V_{BL1}$, $V_{BL2}$ or $V_{BL3}$ if the bit line-adjacent storage element has been previously determined to be in the E-, A-, B- or C-state, respectively. The unselected bit-line adjacent storage element can be on the selected word line WLn and/or diagonally on an adjacent world line Wn+1, for instance.

Figure 6E:
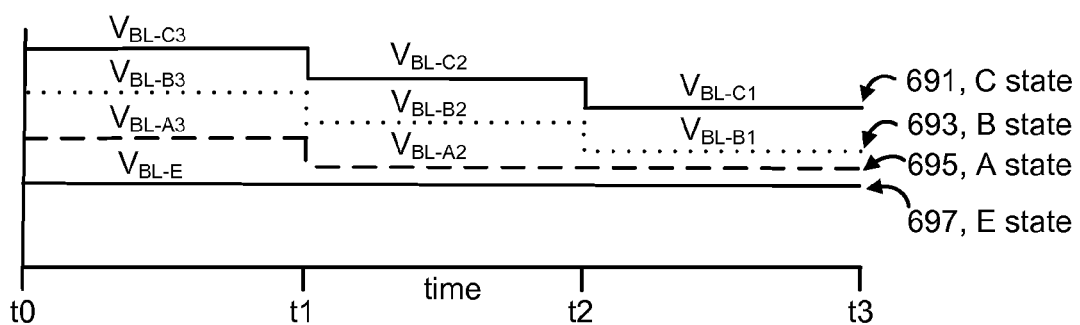
FIG. 6e depicts alternative bit line voltages applied to storage elements based on their states and based on a control gate read voltage.
Figure 7A:
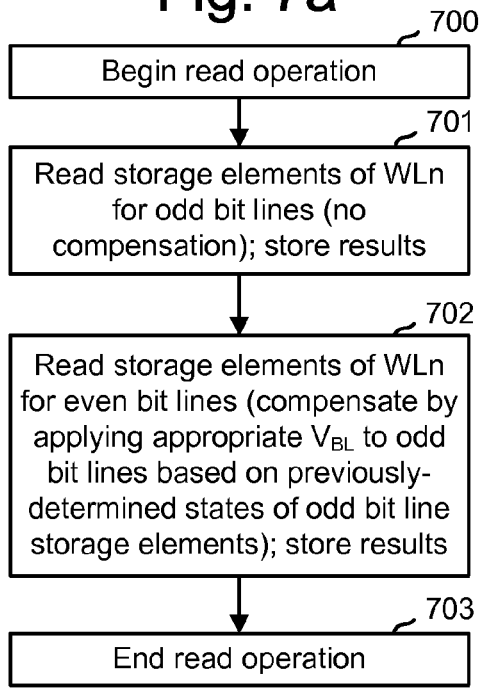
FIG. 7a depicts a reading technique corresponding to FIG. 6b.

FIG. 7a depicts a read operation which corresponds to FIG. 6b. A read operation begins at step 700. At step 701, the odd storage elements of WLn are read with no compensation, and the results are stored. For example, the results can be stored in latches of sense amplifiers which are associated with each bit line, in one possible approach. The results can also be transferred from the latches to a controller memory of the memory device. Note that coupling compensation is not required for the odd-numbered bit lines because they are programmed last, after the even-numbered bit lines. At step 702, the even storage elements of WLn are read with compensation, which may include applying appropriate bit line voltages to the odd bit lines based on previously-determined states of odd bit line storage elements. The read operation ends at step 703.

Figure 2E:
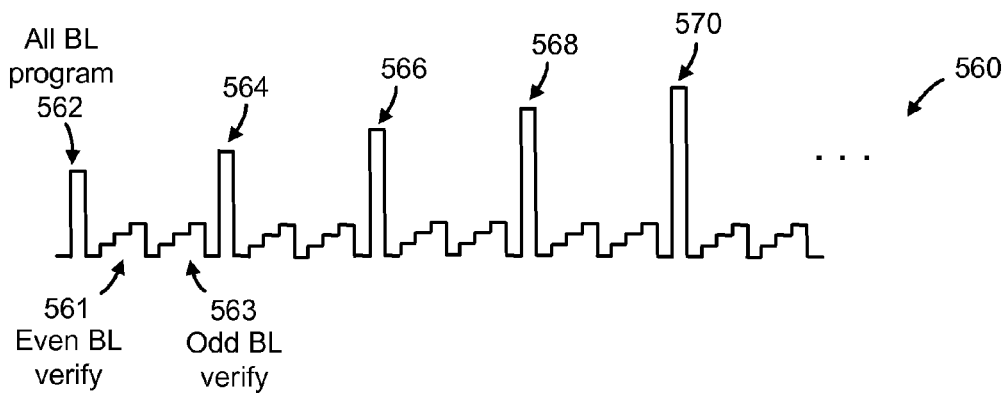
FIG. 2e depicts an example pulse train applied to the control gates of non-volatile storage elements in an all bit line program, even bit line verify, odd bit line verify programming technique.

FIG. 6c depicts bit line voltages applied to storage elements based on their states and based on a control gate read voltage, after programming corresponding to FIG. 2e. In this case, both even and odd storage elements have experienced coupling and therefore are compensated when read. The even and odd storage elements are read separately; typically the even, then the odd. Waveforms 690, 692, 694 and 696 depict bit line voltages which are applied to the unselected storage elements, e.g., to the odd storage elements when the even are read, and to the even storage elements when the odd are read, in correspondence with the control gate read voltage.

Waveform 690 indicates that $V_{BL3}$, $V_{BL2}$ and $V_{BL1}$ are applied to the bit line of the unselected storage elements (e.g., odd) when $V_{CGR-A}$, $V_{CGR-B}$ and $V_{CGR-C}$, respectively, are applied to the selected word line to read the selected storage elements (e.g., even). The unselected storage element can be on the selected word line and/or on an adjacent world line (diagonally), for instance. Compensation for coupling by a bit line-adjacent storage element on the selected word line versus a bit line-adjacent storage element diagonally on an adjacent word line operates on the same in principle, except the magnitude of the bit line voltage which is needed to provide compensation is typically less for the adjacent word line case as the distance to the selected storage element is typically greater than the distance to the selected storage element from the adjacent storage element on the same word line. For example, the distance between storage elements 625 and 623 is greater than the distance between storage elements 625 and 626 (FIG. 4a).

Waveform 692 indicates that $V_{BL2}$, $V_{BL1}$ and $V_{BL0}$ are applied to the bit line of each unselected storage element when $V_{CGR-A}$, $V_{CGR-B}$ and $V_{CGR-C}$, respectively, are applied to the selected word line. Waveform 694 indicates that $V_{BL1}$, $V_{BL0}$ and $V_{BL0}$ are applied to the bit line of each unselected storage element when $V_{CGR-A}$, $V_{CGR-B}$ and $V_{CGR-C}$, respectively, are applied to the selected word line. Waveform 696 indicates that $V_{BL0}$ is applied to the bit line of the unselected storage element when $V_{CGR-A}$, $V_{CGR-B}$ and $V_{CGR-C}$ are applied to the selected word line. Note that the levels of $V_{BL0} < V_{BL1} < V_{BL2} < V_{BL3}$ can be optimized for a specific application. Further, the spacing between these voltages can be in equal or unequal increments.

In order to know the state of the unselected (e.g., odd) storage elements when reading one or more selected (e.g., even) storage elements, an initial "rough" read or pre-read operation can be performed. For example, a rough read can be performed for the even- and odd-numbered storage elements concurrently. The rough read does not provide compensation for coupling but is used to ascertain the state of each storage element with somewhat reduced, but sufficient, accuracy. During the rough read, a fixed $V_{BL}$ can be applied to all bit lines, in one possible approach. Based on the data states which are ascertained by the rough read, different bit line voltages will be used in a subsequent "fine" read which determines with finality the data state of the selected storage elements. The fine read data is what is output to a host device, for instance, in response to a received read command, while the rough read data is used internally to the memory device as temporary data for performing the fine read.

For an even-odd read operation, a fine read is performed on the selected storage elements of the even-numbered bit lines, followed by a fine read on the selected storage elements of the odd-numbered bit lines. Another option is to read the odd storage elements, then the even. During the fine read on the selected storage elements of the even-numbered bit lines, we set their bit line voltages to a common level, e.g., 0.5 V, in one approach. This may be the $V_{BL}$ which is used during a verify operation, for instance. We also set the bit line voltages of the odd-numbered bit lines according to the data states of their associated storage elements as obtained from the rough read and according to the current control gate read voltage. The information gained from the rough read of the odd bit lines is used to compensate the fine read of the even bit lines.

For example, in the fine read of the even bit lines, referring to FIG. 6c, when $V_{CGR-A}$ is applied between t0 and t1, $V_{BL0}$ is applied to the odd-numbered bit lines whose associated storage elements were determined to be state E in the rough read (waveform 696), $V_{BL1}$ is applied to the odd-numbered bit lines whose associated storage elements were determined to be state A in the rough read (waveform 694). $V_{BL2}$ is applied to the odd-numbered bit lines whose associated storage elements were determined to be state B in the rough read (waveform 692). $V_{BL3}$ is applied to the odd-numbered bit lines whose associated storage elements were determined to be state C in the rough read (waveform 690). When $V_{CGR-B}$ is applied between t1 and t2, $V_{BL0}$ is applied to the odd-numbered bit lines whose associated storage elements were determined to be state E or A in the rough read (waveforms 694 and 696), $V_{BL1}$ is applied to the odd-numbered bit lines whose associated storage elements were determined to be state B in the rough read (waveform 692). $V_{BL2}$ is applied to the odd-numbered bit lines whose associated storage elements were determined to be state C in the rough read (waveform 690).

The waveforms 694 and 696 are depicted as being offset between t1 and t2 for clarity only. The waveforms 692, 694 and 696 are depicted as being offset between t2 and t3 for clarity only.

When $V_{CGR-C}$ is applied between t2 and t3, $V_{BL0}$ is applied to the odd-numbered bit lines whose associated storage elements were determined to be state E, A or B in the rough read (waveforms 692, 694 and 696), and $V_{BL1}$ is applied to the odd-numbered bit lines whose associated storage elements were determined to be state C in the rough read (waveform 690).

Subsequently, during the fine read on the selected storage elements of the odd-numbered bit lines, we read the selected storage elements of the odd-numbered bit lines while setting their bit line voltages to a common level, e.g., 0.5 V, in one approach. We also set the bit lines voltages of the even-numbered bit lines according to FIG. 6c.

Figure 7B:
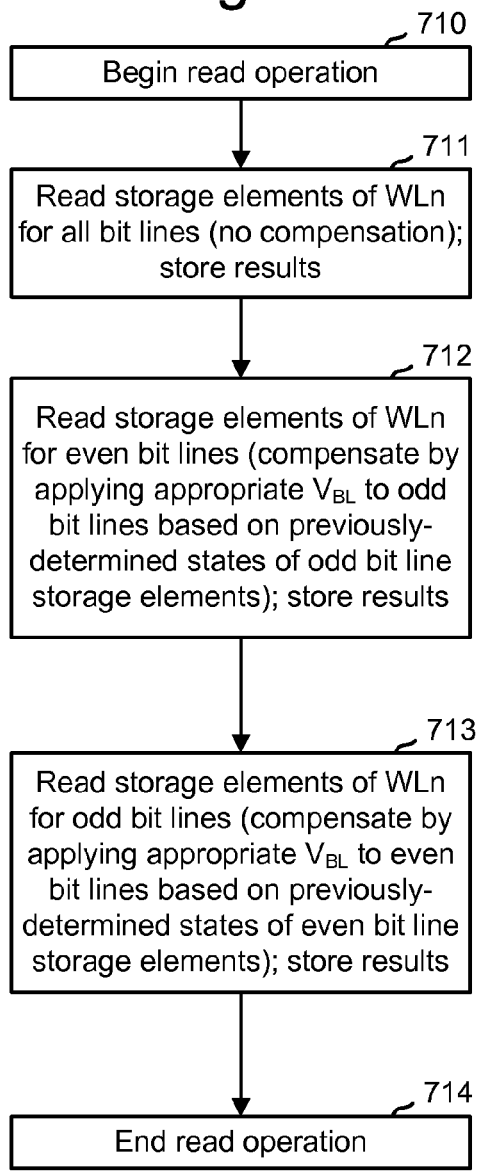
FIG. 7b depicts a reading technique corresponding to FIG. 6c.

FIG. 7b depicts a read operation which corresponds to FIG. 6c. A read operation begins at step 710. At step 711, the even and odd storage elements of WLn are read, in a rough read, with no compensation, and the results are stored. At step 712, the even storage elements of WLn are read in a fine read, with compensation, which may include applying appropriate bit line voltages to the odd bit lines based on previously-determined states of odd bit line storage elements. The results are stored, and may over write the results from the rough read for the even-numbered bit lines. At step 713, the odd storage elements of WLn are read in a fine read, with compensation, which may include applying appropriate bit line voltages to the even bit lines based on previously-determined states of even bit line storage elements. The results are stored, and may over write the results from the rough read for the odd-numbered bit lines. The read operation ends at step 714.

Figure 2F:
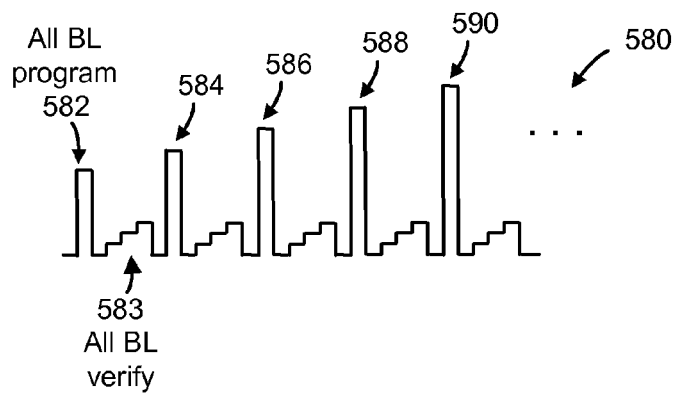
FIG. 2f depicts an example pulse train applied to the control gates of non-volatile storage elements in an all bit line program, all bit line verify programming technique.

FIG. 6d depicts bit line voltages applied to storage elements based on their states and based on a control gate read voltage, after programming corresponding to FIG. 2f. The time axis is the same as in FIG. 6a. In a further option, all bit line sensing can be used instead of even-odd sensing. In this approach, all bit lines are read together in both the rough read and the fine read. This can provide better performance in terms of faster read speed, for example. In an all bit line implementation, the bit line voltages of FIG. 6d are the same as in FIG. 6c except $V_{BL1}=V_{BL}$, which may be, e.g., a bit line voltage which is used during a verify operation. $V_{BL}$ is set at a level which results in an accurate read level for a selected storage element on the same bit line rather than a level which results in coupling compensation for a storage element on another bit line. As an example, the magnitude of $V_{BL}$ is between $V_{BL0}$ and $V_{BL2}$, although this is not required, as $V_{BL}$ can have any appropriate magnitude. The bit line voltage need only be set to $V_{BL}$ when the control gate voltage is at a level which corresponds to the previously determined state of an associated storage element. The particular bit line voltage can be set at a level for compensating an adjacent bit line when the control gate voltage is at a level which does not correspond to the previously determined state of the particular bit line's associated storage element.

For example, referring to waveform 694, note that $V_{BL1}=V_{BL}$ is used on A-state storage elements when an A-read is being performed, that is, when $V_{CGR-A}$ is applied to the selected word line between t0 and t1 for a selected storage element which was previously ascertained to be in state A from the rough read. Similarly, referring to waveform 692, $V_{BL1}=V_{BL}$ is used on the B-state storage elements when $V_{CGR-B}$ is applied between t1 and t2. Lastly, referring to waveform 690, $V_{BL1}=V_{BL}$ is used on the C-state storage elements when $V_{CGR-C}$ is applied between t2 and t3. Thus, the bit line voltage is set at an appropriate level for reading a particular state when the $V_{CGR}$ corresponds to the particular state, and the bit line voltage is set at an appropriate level for coupling compensation at other times. This ensures that the sensing is performed correctly for the storage elements while still providing coupling compensation.

Thus, for example, between t0 and t1, a storage element ascertained to be in state E, A, B or C from the rough read will receive $V_{BL0}$, $V_{BL}$, $V_{BL2}$ or $V_{BL3}$, respectively. Between t1 and t2, a storage element ascertained to be in state E, A, B or C from the rough read will receive $V_{BL0}$, $V_{BL0}$, $V_{BL}$ or $V_{BL2}$, respectively. Between t2 and t3, a storage element ascertained to be in state E, A, B or C from the rough read will receive $V_{BL0}$, $V_{BL0}$, $V_{BL0}$ or $V_{BL1}$, respectively.

Thus, for each control gate read voltage, a bit line voltage is set according to whether or not the previously ascertained data state of an associated storage element corresponds to the control gate voltage. If there is a correspondence, the bit line voltage is set to $V_{BL}$ which is independent of the ascertained data state since it is used for all data states. If there is no such correspondence, the bit line voltage is set to a level of $V_{BL0}$, $V_{BL2}$ or $V_{BL3}$, which depends on the ascertained data state. It is acceptable for a storage element to be read in the fine read with a bit line voltage which can alter the read result when the control gate read voltage is at a "don't care" level. For instance, for a storage element which is determined to be in the C-state in the rough read, in the subsequent fine read, the control gate read voltages of $V_{CGR-A}$ and $V_{CGR-B}$ are "don't care" levels, so that $V_{BL3}$ or $V_{BL2}$ can be used, while $V_{CGR-C}$ is a "care" level, so that $V_{BL}$ is used. $V_{CGR-C}$ corresponds to the previously-determined C-state.

Figure 7C:
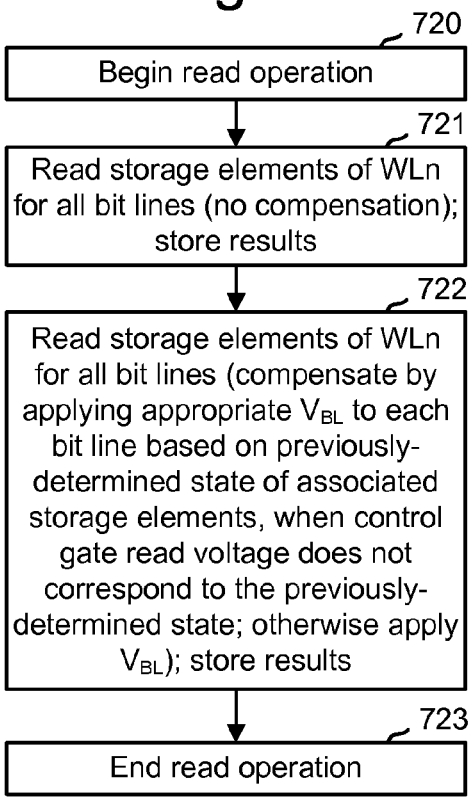
FIG. 7c depicts a reading technique corresponding to FIG. 6d.

FIG. 7c depicts a reading technique corresponding to FIG. 6d. A read operation begins at step 720. At step 721, the even and odd storage elements of WLn are read, in a rough read, with no compensation, and the results are stored. At step 722, the even and odd storage elements of WLn are read in a fine read, with compensation, which may include applying an appropriate bit line voltage to each bit line based on a previously-determined state of an associated storage element, according to whether or not the current control gate read voltage corresponds to the previously-determined state. Specifically, the nominal value of $V_{BL}$ is used when there is such a correspondence. When there is no such correspondence, $V_{BL0}$, $V_{BL2}$ or $V_{BL3}$ is used. The results are stored, and may over write the results from the rough read. The read operation ends at step 723.

The compensation techniques discussed herein can be used with different programming techniques. One possible programming technique is full sequence programming, such as discussed in connection with FIG. 15 below. Another possible programming technique involves using a lower-middle (LM) state such as discussed below in connection with FIGS. 17a-c. In this case, the amount of coupling which needs to be compensated is reduced, so we can compensate state E to A and state LM to C coupling effects almost completely. Further, the optimal bit line voltage levels can be different from those shown in FIGS. 6b-6d. For example, in case the selected storage element is ascertained to be in the B-state from the rough read, we may use $V_{BL0}$ for the adjacent bit lines, assuming odd-even reading, because the coupling from state LM to B is relatively small. The specific bit line voltages which are optimal for a given memory device and programming and read scheme can be determined by experimentation, computer modeling and other approaches. A lookup table or other data structure can provide appropriate bit line voltages based on data state and control gate read level.

FIG. 6e depicts alternative bit line voltages applied to storage elements. These are generalized alternatives to the bit line voltages of any of FIGS. 6b-d, for instance. Note that $V_{BL1}$, $V_{BL2}$ and $V_{BL3}$ are voltages which are used to compensate for data states which are one, two, or three data states apart, respectively. For example, $V_{BL1}$ is sufficient to compensate for state E to A, state A to B or state B to C coupling (one state difference). Similarly, $V_{BL2}$ is sufficient to compensate for state E to B or state A to C coupling (two state difference) and the maximum bit line voltage $V_{BL3}$ is sufficient to compensate for state E to C coupling (three state difference). In FIGS. 6b-6d, there are $2^N$ data states and $2^N$ possible bit line voltages, where N>2.

In another possible approach, additional bit line voltages are provided, e.g., more than $2^N$ possible bit line voltages. In this case, it is not assumed that $V_{BL1}$, $V_{BL2}$ and $V_{LB3}$ are optimal to compensate for coupling of all one state, two state and three state differences, respectively. Instead, a specific bit line voltage is used for one or more specific couplings. For example, instead of using the same voltage $V_{BL1}$ to compensate for state E to A, A to B and B to C coupling, we note that in practice, state E to A coupling, for instance, may be greater than state A to B or B to C coupling, so to improve the accuracy of the coupling compensation, we can use one bit line voltage for state E to A compensation, another bit line voltage for state A to B compensation, another bit line voltage for state B to C compensation and so forth. Thus, a bit line voltage for each specific coupling combination could be used. It is also possible to group certain coupling combinations which have approximately the same coupling magnitude and use a common bit line voltage for them. For instance, one bit line voltage may be appropriate to compensate for state E to A coupling while another bit line voltage may be appropriate to compensate for state A to B and B to C coupling. By providing more bit line voltage levels, we can potentially compensate different BL-BL effects more accurately, albeit with some overhead cost. Appropriate use of memory and processor resources in the memory device can be used to carry out the desired technique.

For example, for compensating coupling caused by a C-state storage element, waveform 691 has levels of $V_{BL-C3}$, $V_{BL-C2}$ and $V_{BL-C1}$ for use when $V_{CGR-A}$, $V_{CGR-B}$ and $V_{CGR-C}$, respectively, are applied to the selected word line. For compensating coupling caused by a B-state storage element, waveform 693 has levels of $V_{BL-B3}$, $V_{BL-B2}$ and $V_{BL-B1}$ for use when $V_{CGR-A}$, $V_{CGR-B}$ and $V_{CGR-C}$, respectively, are applied. For compensating coupling caused by an A-state storage element, waveform 695 has levels of $V_{BL-A3}$, $V_{BL-A2}$ and $V_{BL-A1}$ for use when $V_{CGR-A}$, $V_{CGR-B}$ and $V_{CGR-C}$, respectively, are applied. For compensating coupling of an E-state storage element, waveform 697 has a level of $V_{BL-E}$ which can be the same as $V_{BL0}$, for instance. Here, there are nine different bit line voltages.

FIG. 8a depicts control gate read voltages applied to a selected word line during a read operation. FIG. 8b depicts read pass voltages applied to an adjacent word line during a read operation. Compensation for a word line-adjacent storage element may be provided alone, or in combination with compensation of bit line-adjacent storage elements. Word line-to-word line interference or coupling may be caused by a word line-adjacent storage element. For example, in FIG. 4a, storage element 622 is word line-adjacent to storage element 625, on the adjacent word line WLn+1. In general, once programming is completed for the storage elements on WLn, they are subject to coupling effects when the storage elements on WLn+1 are subsequently programmed.

Since storage element 622 is on the same bit line as the storage element 625 which is being read, $V_{BL}$ needs to be at a certain level to provide correct reading of storage element 625 and thus cannot be adjusted to compensate for the coupling due to storage element 622. Instead, the read pass voltage which is applied to WLn+1 can be adjusted to provide such compensation. Generally, during a read operation, a fixed read pass voltage is typically applied to the unselected word lines to ensure that the unselected storage elements are driven to a conductive state. The unselected storage elements are typically driven at a level which turns on (makes conductive) the channel of the unselected storage elements. Here, WLn+1 receives a special multi-level read pass voltage which couples to the floating gate of the selected storage element on WLn to provide a desired coupling compensation. A higher amount of coupling can be achieved by applying a higher read pass voltage to WLn+1. A higher read pass voltage on WLn+1 lowers the $V_{TH}$ of a selected storage element and hence provides compensation.

Since the read pass voltage on WLn+1 is applied to all storage elements on the word line, and since the storage elements on WLn which are being read typically have been programmed to different data states, one possible approach accommodates all possible combinations of data states on WLn and read pass voltages on WLn+1. Specifically, there are 2N-1 control gate read voltages which are applied to WLn, as depicted in FIG. 8a, and $2^N$ possible read pass voltages which are applied to WLn+1, for each control gate read voltage, as depicted in FIG. 8b. Thus, between t0 and t1, while $V_{CGR-A}$ is applied to WLn, a sequence of read pass voltages including voltages referred to as $V_{READ}$, $V_{READ-A}$, $V_{READ-B}$ and $V_{READ-C}$ are applied to WLn+1 at time intervals t0-t0A, t0A-t0B, t0B-t0C and t0C-t1, respectively. The sequence of read pass voltages is repeated between t1 and t2 when $V_{CGR-B}$ is applied to WLn, and between t2 and t3 when $V_{CGR-C}$ is applied to WLn. Moreover, for each control gate read voltage on WLn, it is only necessary to observe the result which is associated with one of the read pass voltages which corresponds to the known state of the WLn+1 storage element.

Thus, based on the rough read, the data states of a selected storage element and a word line-adjacent storage element can be ascertained, and in the subsequent fine read, a read pass voltage which corresponds to the state of the word line-adjacent storage element can be identified, e.g., by storing appropriate data. This identification indicates when a selected storage element should be sensed. As explained further below in connection with FIG. 13, sensing may include pre-charging a bit line and then observing the rate at which a capacitor in a sense amplifier discharges when coupled to the bit line. Other sensing techniques include comparing a current on the bit line to a reference current. In any case, the sensing for a given bit line can be performed at a designated time which corresponds to the identified read pass voltage on WLn+1, for each of the control gate read voltages.

For example, if the rough read indicates that the WLn+1 storage element is in state C, the read result which is associated with $V_{READ-PASS-C}$ on WLn+1 is observed when each of $V_{CGR-A}$, $V_{CGR-B}$ and $V_{CGR-A}$ are applied to WLn, e.g., at time intervals t0C-t1, t1C-t2 and t2C-t3, respectively. Read results for the storage element on WLn need not be obtained when $V_{READ-PASS}$, $V_{READ-PASS-A}$ and $V_{READ-PASS-B}$ are on WLn+1, e.g., at time intervals t0-t0C, t1-t1C and t2-t2C, respectively. Specifically, considering only when $V_{READ-PASS-C}$ is on WLn+1, for instance, if the selected storage element is detected to be in a conductive state with $V_{CGR-A}$ on WLn, at time interval t0C-t1, then it is known that the selected storage element is in state E and reading of the selected storage element is completed. If the selected storage element is detected to be in a non-conductive state with $V_{CGR\text{-}A}$ on WLn, but in a conductive state with $V_{CGR\text{-}B}$ on WLn, at time interval t1C-t2, then it is known that the selected storage element is in state A and reading of the selected storage element is completed. If the selected storage element is detected to be in a non-conductive state with $V_{CGR\text{-}A}$ or $V_{CGR\text{-}B}$ on WLn, but in a conductive state with $V_{CGR\text{-}C}$ on WLn, at time interval t2C-t3, then it is known that the selected storage element is in state B and reading of the selected storage element is completed. If the selected storage element is detected to be in a non-conductive state with $V_{CGR\text{-}A}$, $V_{CGR\text{-}B}$ or $V_{CGR\text{-}C}$ on WLn, then it is known that the selected storage element is in state C and reading of the selected storage element is completed. In each of the above cases, appropriate coupling compensation is provided for the word line-adjacent storage element on WLn+1 which is in state C due to the pass voltage on WLn+1.

The appropriate portion of the waveform in FIG. 8b is thus used based on the determined state of the word line-adjacent storage element in WLn+1 from the rough read. In this manner, coupling from the word line-adjacent storage element can be compensated. Moreover, this compensation can be provided in combination with compensation of the bit-line adjacent storage elements, including those on the same world line and those on the adjacent word line (diagonally).

Compensating for coupling from word line-adjacent storage elements is discussed further in US2008/0158973, titled "Complete Word Line Look Ahead With Efficient Data Latch Assignment In Non-Volatile Memory Read Operations," incorporated herein by reference.

FIG. 9a depicts a read operation which includes compensation for diagonally bit line-adjacent storage elements. Coupling compensation due to diagonally bit line-adjacent storage elements (such as storage elements 621 and 623 which are diagonally bit line-adjacent to storage element 625 in FIG. 4a) can be performed. In this approach, a read operation begins at step 900. At step 901, a rough read is performed, with no coupling compensation, on the storage elements and the results are stored. Step 902 includes performing a fine read, with coupling compensation, on the storage elements of WLn for even-numbered bit lines, and the results are stored. The compensation may include applying an appropriate bit line voltage to the odd bit lines based on the previously determined states of the diagonal storage elements on the WLn+1 odd bit lines. The results are stored. Step 903 includes performing a fine read, with coupling compensation, on the storage elements of WLn for odd-numbered bit lines, and the results are stored. The compensation may include applying an appropriate bit line voltage to the even bit lines based on the previously determined states of the diagonal storage elements on the WLn+1 even bit lines. The read operation ends at step 904.

FIG. 9b depicts a read operation which includes compensation for a word line-adjacent storage element. Coupling compensation due to word line-adjacent storage elements (such as storage element 622 which is word line-adjacent to storage element 625 in FIG. 4a) can be performed. In this approach, a read operation begins at step 910. At step 911, a rough read is performed, with no coupling compensation, on the storage elements of the adjacent word line WLn+1 for all bit lines, and the results are stored. For even-odd reading, step 912 includes performing a fine read, with coupling compensation, on the storage elements of WLn for even-numbered bit lines, and the results are stored. The compensation may include performing sensing when an appropriate read pass voltage is applied to WLn+1 which corresponds to the previously-determined state of the WLn+1 adjacent storage element, as discussed above in connection with FIGS. 8a and 8b. The results are stored. Step 913 includes performing a read, with coupling compensation, on the storage elements of WLn for odd-numbered bit lines, and the results are stored. The compensation may be provided as in step 912. The read operation ends at step 915.

For all bit line (ABL) reading, step 914 includes performing a fine read, with coupling compensation, on the storage elements of WLn for all bit lines, and the results are stored. The compensation may include performing sensing when an appropriate read pass voltage is applied to WLn+1 which corresponds to the previously-determined state of the WLn+1 adjacent storage element.

FIG. 10a depicts a read operation which includes compensation for diagonally bit line-adjacent storage elements, and a word line-adjacent storage element. In this approach, a read operation begins at step 1000. At step 1001, a rough read is performed, with no coupling compensation, on the storage elements of the adjacent word line WLn+1 for all bit lines, and the results are stored. Step 1002 includes performing a read, with coupling compensation, on the storage elements of WLn for even-numbered bit lines, and the results are stored. The compensation may include: (a) performing sensing when an appropriate read pass voltage is applied to WLn+1 which corresponds to the previously-determined state of the WLn+1 adjacent storage element, as discussed above in connection with FIGS. 8a and 8b, and (b) applying an appropriate bit line voltage to the odd bit lines based on the previously determined states of the WLn+1 storage elements on the odd bit lines. The results are stored. Step 1003 includes performing a read, with coupling compensation, on the storage elements of WLn for odd-numbered bit lines, and the results are stored. The compensation may include: (a) performing sensing when an appropriate read pass voltage is applied to WLn+1 which corresponds to the previously-determined state of the WLn+1 adjacent storage element, and (b) applying an appropriate bit line voltage to the even bit lines based on the previously determined states of the WLn+1 storage elements on the even bit lines. The results are stored. The read operation ends at step 1004.

When providing compensation for both the WLn+1 word line-adjacent storage element and the WLn+1 diagonal bit line-adjacent storage elements, the bit line voltage used for the diagonal bit line-adjacent storage element can be adjusted in concert with the word line voltage. For instance, when the read pass voltage is higher, the bit line voltage may be lower so that the coupling compensation is not excessive. Experimentation and computer simulations can be performed to determine the appropriate bit line level which yields a desired coupling compensation in combination with a given read pass voltage. A lookup table or similar data structure can be maintained by the controller of the memory device which provides the optimum bit line voltage to be applied in concert with different read pass voltages.

FIG. 10b depicts a read operation which includes compensation for same-world line, bit line-adjacent storage elements, and a word line-adjacent storage element. In this approach, a read operation begins at step 1010. At step 1011, a rough read is performed, with no coupling compensation, on the storage elements of WLn, and, separately, on the adjacent word line WLn+1 for all bit lines, and the results are stored. For even-odd reading, step 1012 includes performing a read, with coupling compensation, on the storage elements of WLn for even-numbered bit lines, and the results are stored. The compensation may include: (a) performing sensing when an appropriate read pass voltage is applied to WLn+1 which corresponds to the previously-determined state of the WLn+1 adjacent storage element, as discussed above in connection with FIGS. 8a and 8b, and (b) applying an appropriate bit line voltage to the odd bit lines based on the previously determined states of the WLn storage elements on the odd bit lines. The results are stored. Step 1013 includes performing a read, with coupling compensation, on the storage elements of WLn for odd-numbered bit lines, and the results are stored. The compensation may include: (a) performing sensing when an appropriate read pass voltage is applied to WLn+1 which corresponds to the previously-determined state of the WLn+1 adjacent storage element, and (b) applying an appropriate bit line voltage to the even bit lines based on the previously determined states of the WLn storage elements on the even bit lines. The read operation ends at step 1015.

For all bit line (ABL) reading, step 1014 includes performing a read, with coupling compensation, on the storage elements of WLn for all bit lines, and the results are stored. The compensation may include: (a) performing sensing when an appropriate read pass voltage is applied to WLn+1 which corresponds to the previously-determined state of the WLn+1 adjacent storage element, and (b) applying an appropriate bit line voltage to the bit lines based on the previously determined states of the WLn storage elements on the bit lines.

Figure 11:
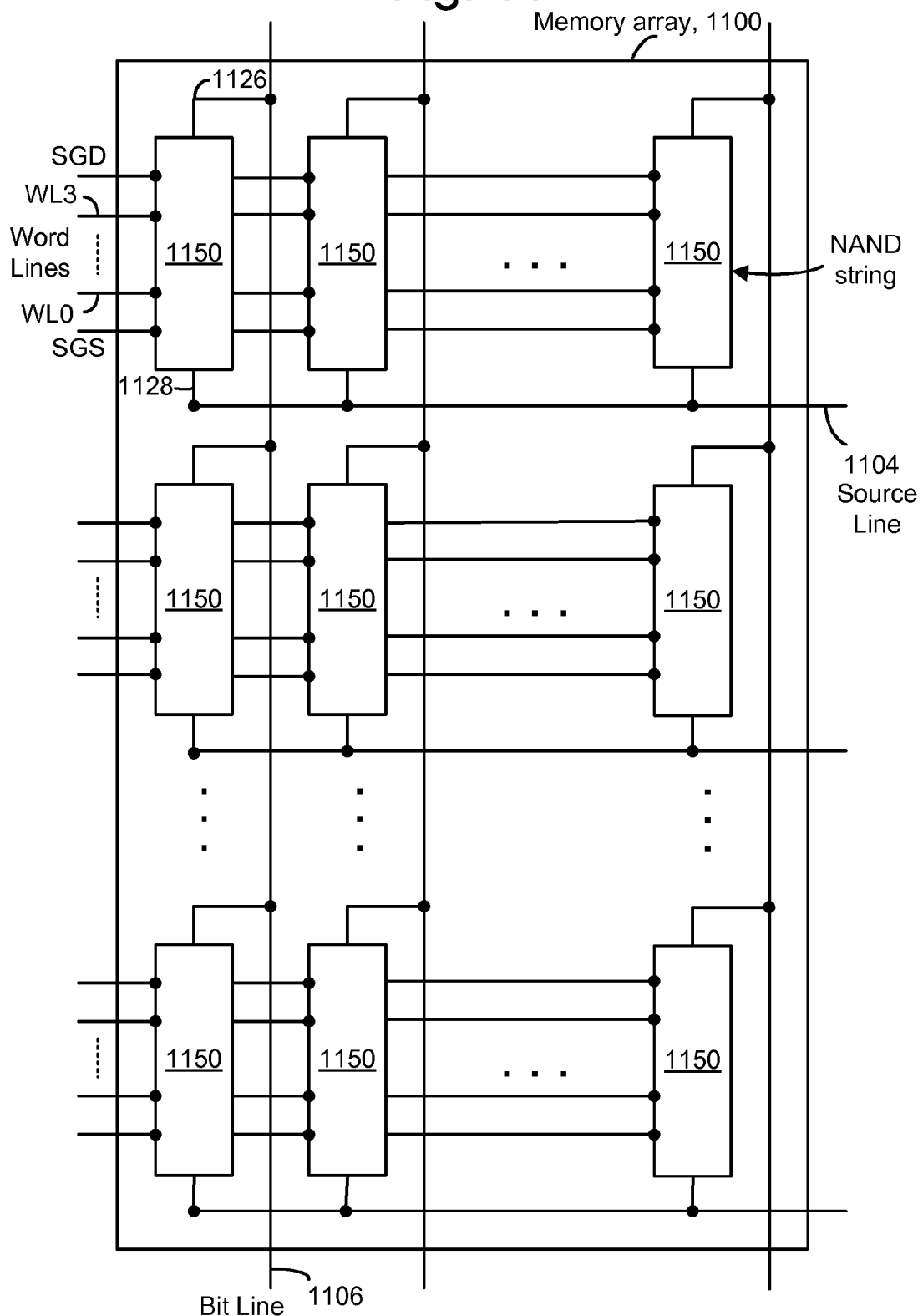
FIG. 11 is a block diagram of an array of NAND flash storage elements.

FIG. 11 illustrates an example of an array 1100 of NAND storage elements, such as those shown in FIGS. 1a and 1b. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from eight pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
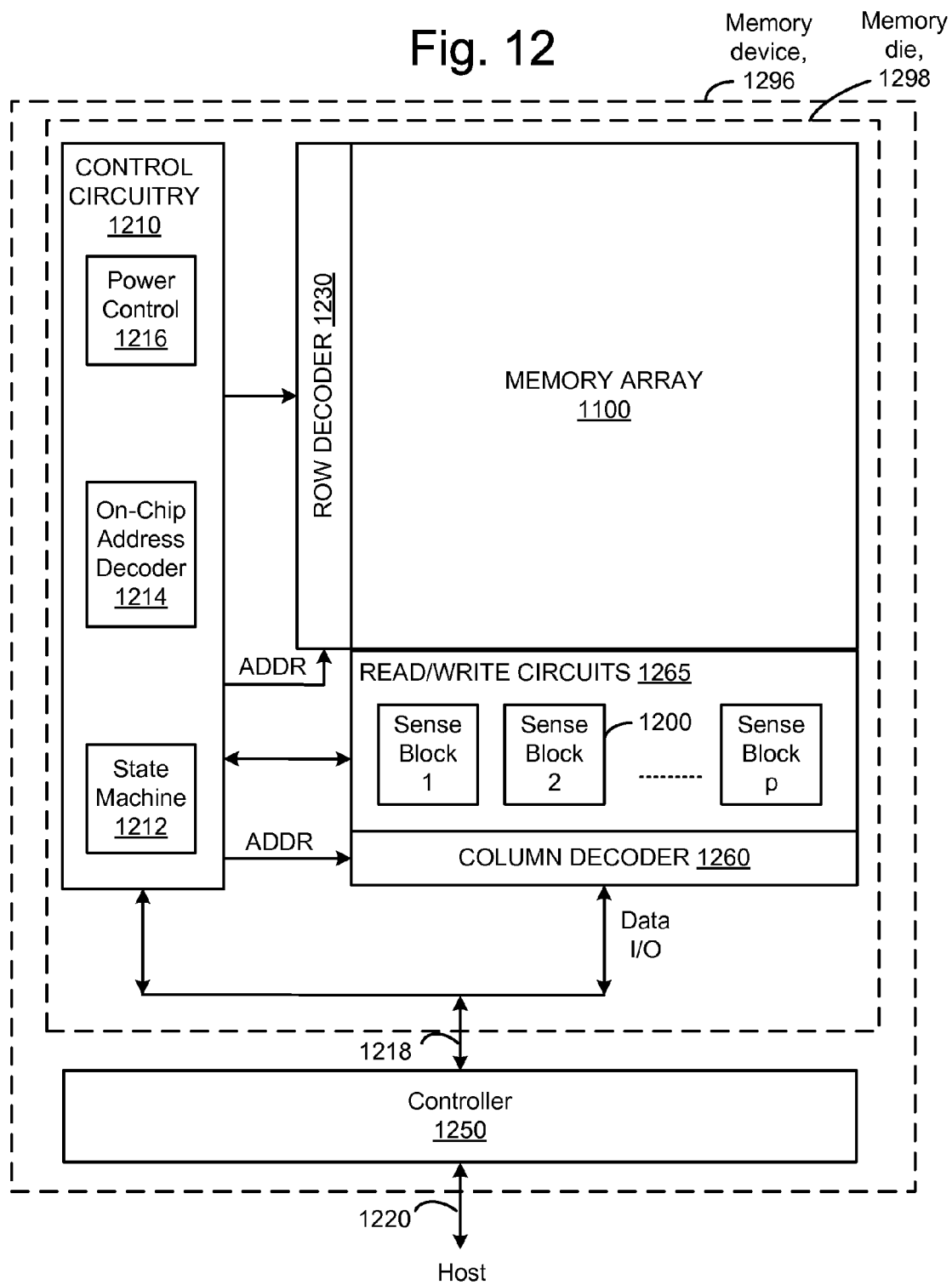
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214 and a power control module 1216. The state machine 1212 provides chip-level control of memory operations, and may include an ECC decoding engine. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, and so forth.

In another approach, the non-volatile memory system uses dual row/column decoders and read/write circuits in which access to the memory array 1100 by the various peripheral circuits is implemented in a symmetric fashion, on opposite sides of the array, so that the densities of access lines and circuitry on each side are reduced by half. Thus, two row decoders, two column decoders, read/write circuits connecting to bit lines from the bottom and read/write circuits connecting to bit lines from the top of the array 1100.

Figure 13:
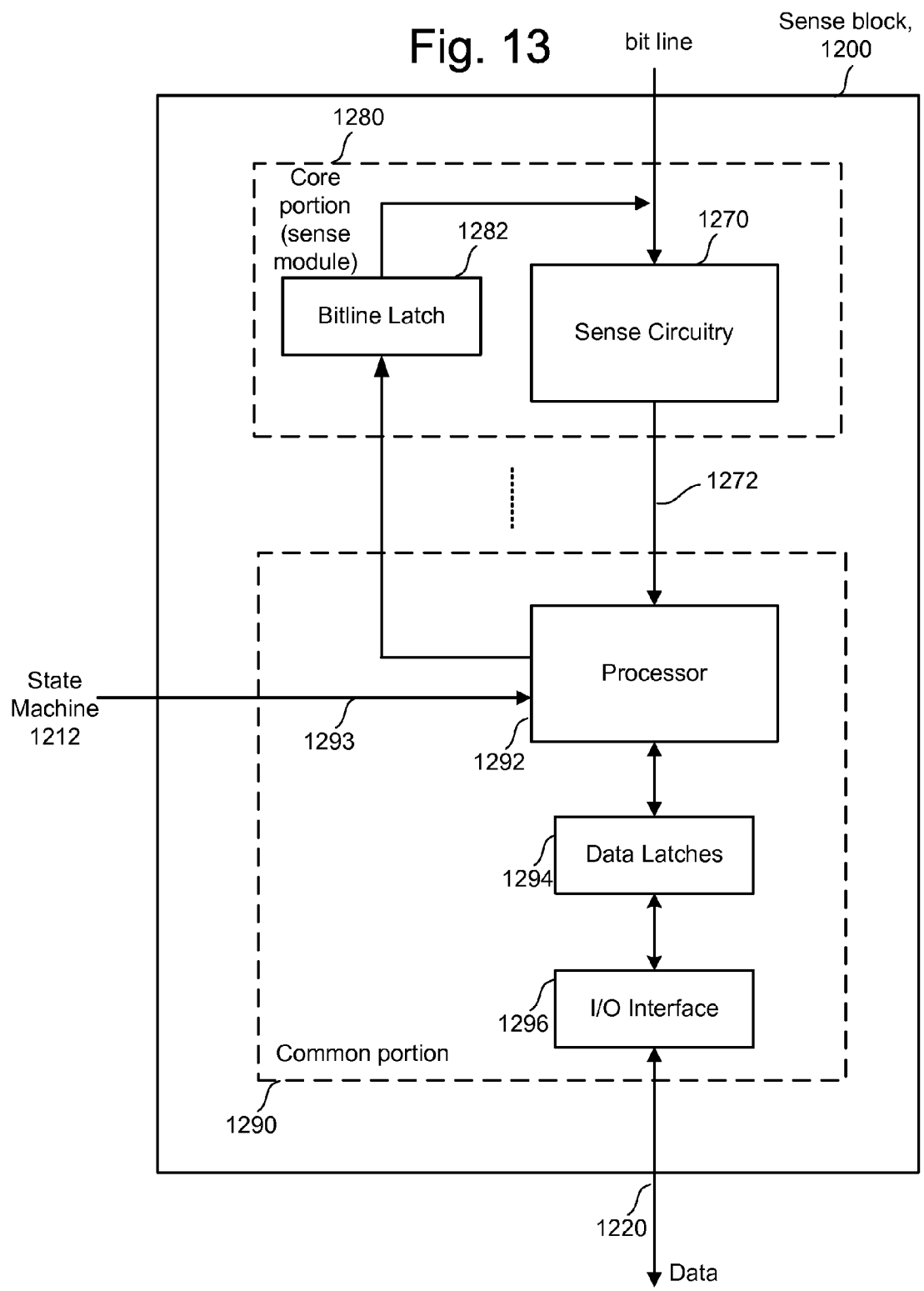
FIG. 13 is a block diagram depicting one embodiment of a sense block.

FIG. 13 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 14:
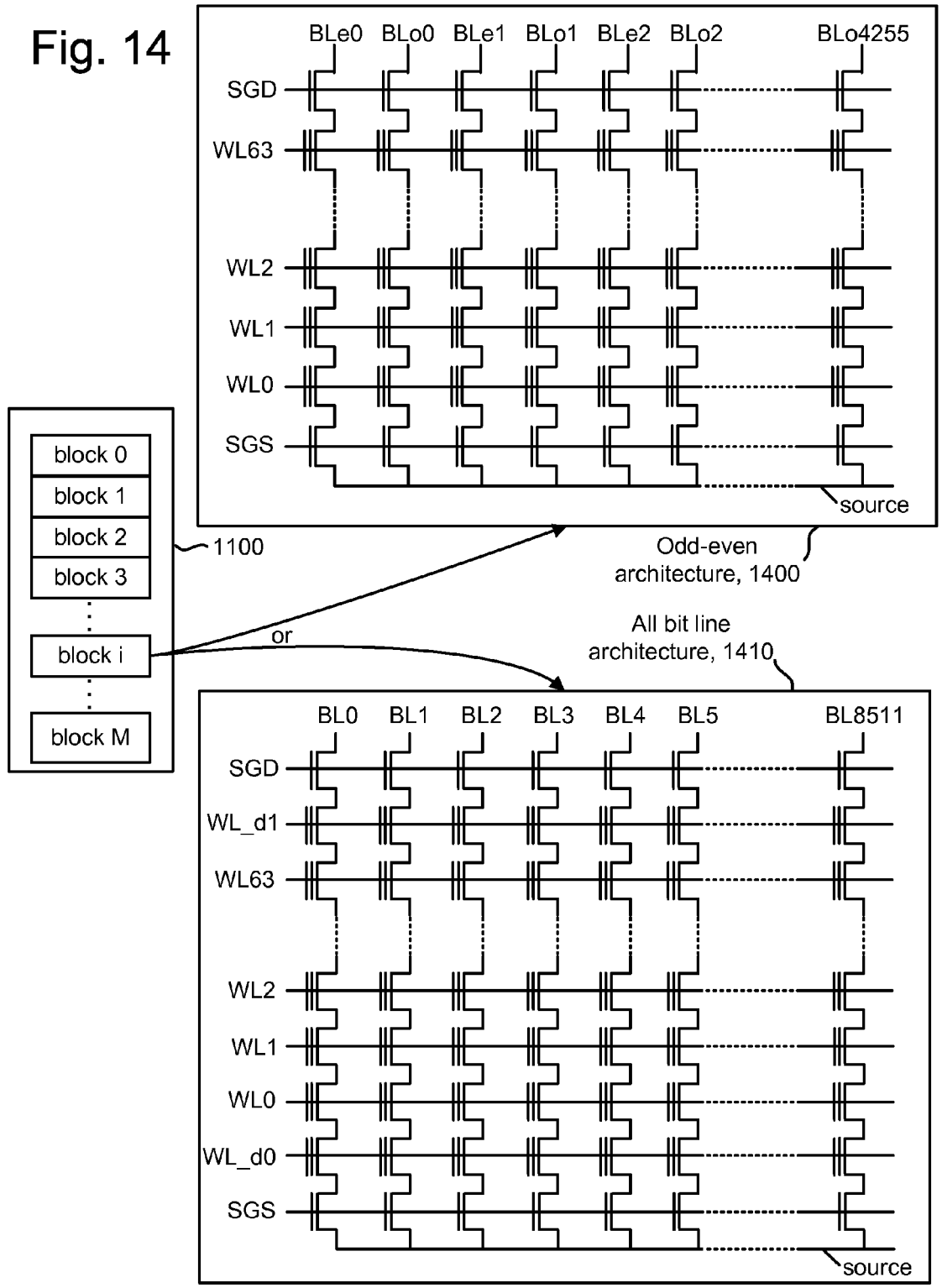
FIG. 14 illustrates an example of an organization of a memory array into blocks for an all bit line memory architecture or for an even-odd memory architecture.

FIG. 14 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1410), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1400), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 15:
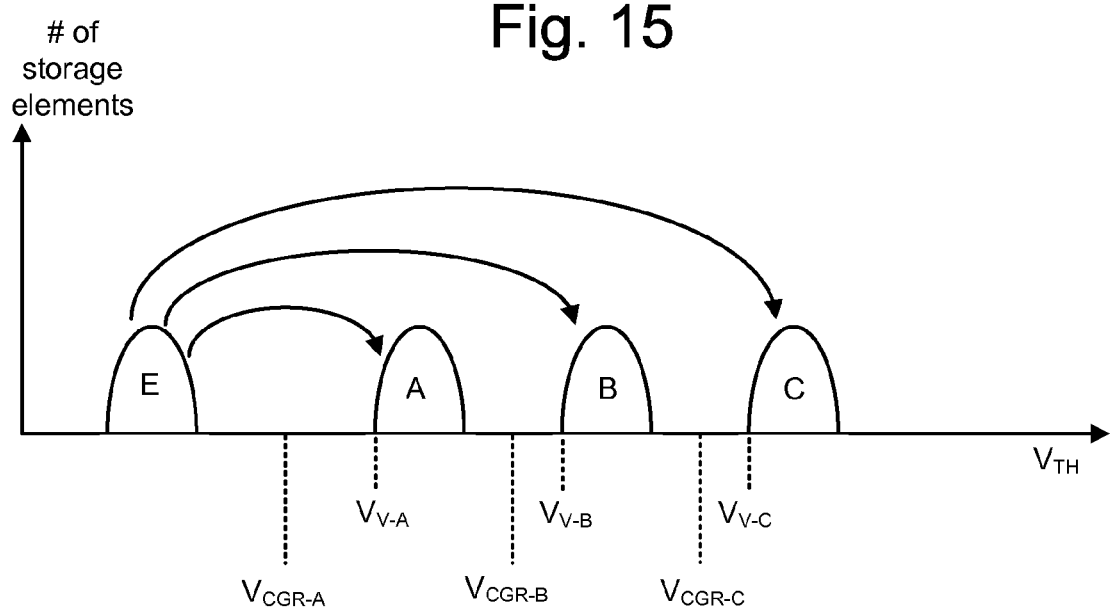
FIG. 15 depicts an example set of threshold voltage distributions and one-pass programming.

FIG. 15 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, $V_{CGR-A}$, $V_{CGR-B}$ and $V_{CGR-C}$, are also provided for reading data from storage elements. By testing whether the threshold voltage of a given storage element is above or below $V_{CGR-A}$, $V_{CGR-B}$ and $V_{CGR-C}$, the system can determine the state, e.g., programming condition, the storage element is in.

Further, three verify reference voltages, $V_{V-A}$, $V_{V-C}$ and $V_{V-C}$, are provided. When programming storage elements to state A, the system will test whether those storage elements have a threshold voltage greater than or equal to $V_{V-A}$. When programming storage elements to state B, the system will test whether the storage elements have threshold voltages greater than or equal to $V_{V-A}$. When programming storage elements to state C, the system will determine whether storage elements have their threshold voltage greater than or equal to $V_{V-C}$.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequences of FIGS. 2d-2f will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 16:
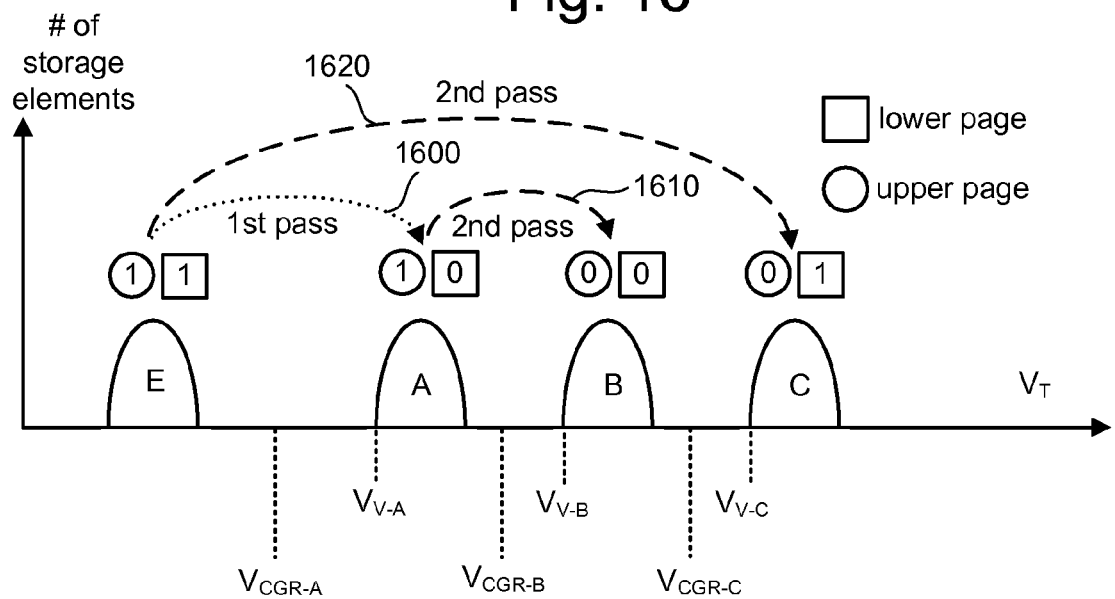
FIG. 16 depicts an example set of threshold voltage distributions and two-pass programming.

FIG. 16 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1600. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1620. If the storage element had been programmed into state A as a result of the first programming pass, then the storage element is further programmed in the second pass so that the threshold voltage is increased to be within state B, as depicted by arrow 1610. The result of the second pass is to program the storage element into the state designated to store a logic "0" for the upper page without changing the data for the lower page. In both FIG. 15 and FIG. 16, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, incorporated herein by reference in its entirety.

Figure 17A:
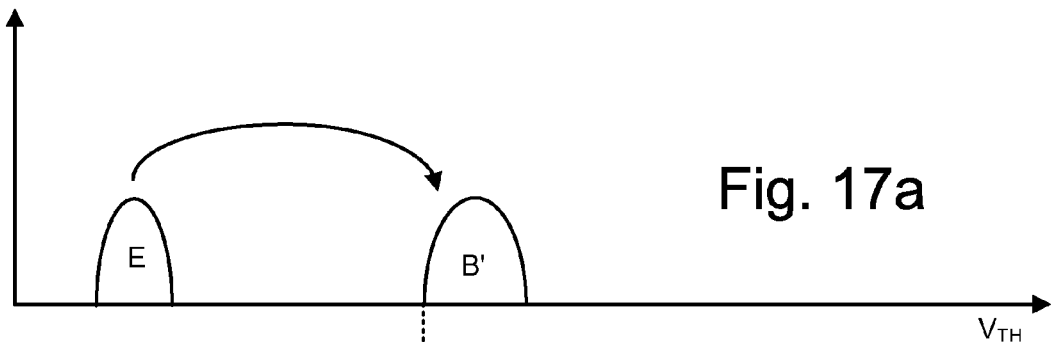
FIGS. 17a-c show various threshold voltage distributions and describe a process for programming non-volatile memory.
Figure 17B:
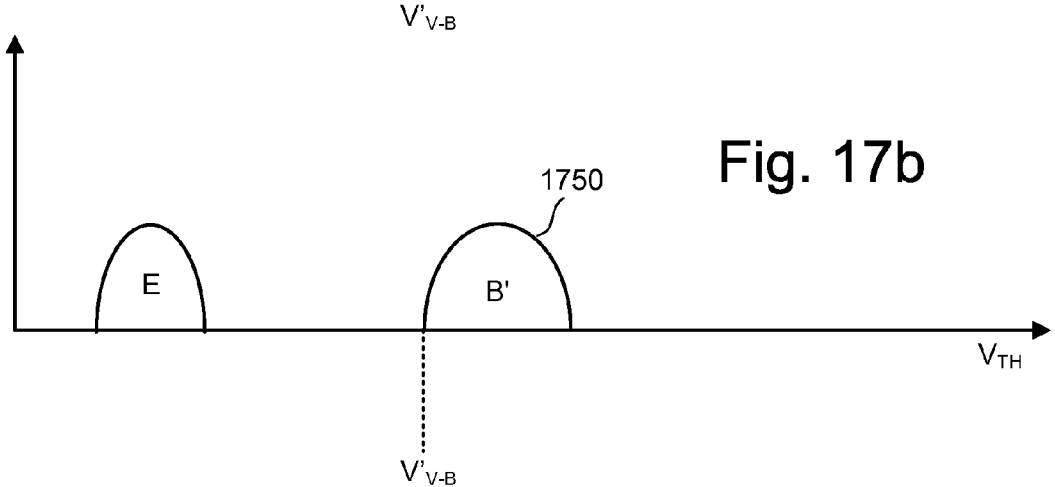
Figure 17C:
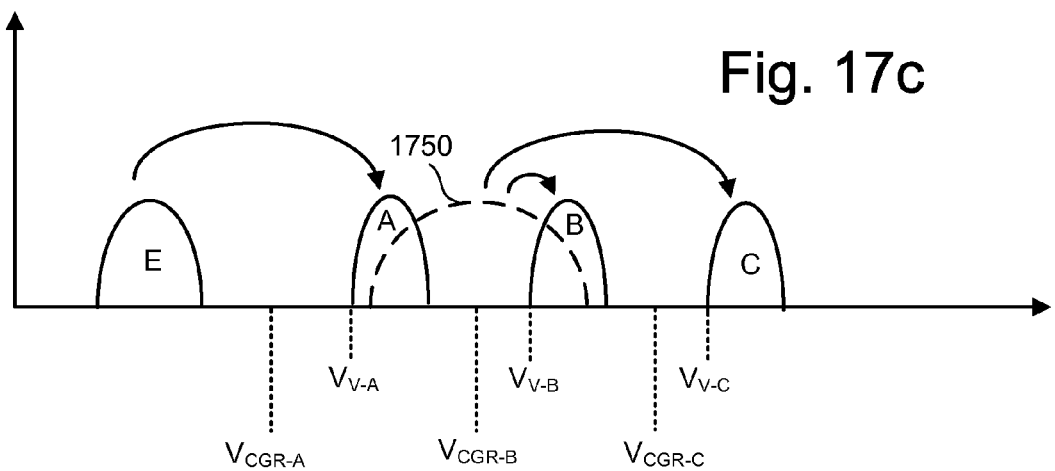

FIGS. 17*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. This is a sometimes referred to as a lower-middle or LM state. FIG. 17*a* therefore shows the programming of storage elements from state E to state B'. State B' is an interim state B; therefore, the verify point is depicted as V'$_{V\text{-}B}$, which is lower than V$_{V\text{-}B}$.

In one embodiment, after a storage element is programmed from state E to state B', its neighbor storage element (WLn+1) in the NAND string will then be programmed with respect to its lower page. For example, looking back at FIG. 1*b*, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1750 of FIG. 17*b*. This apparent widening of the threshold voltage distribution will be remedied when programming the upper page.

FIG. 17*c* depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1750 and the upper page data is to remain at 1, then the storage element will be programmed to final state B. If the storage element is in intermediate threshold voltage distribution 1750 and the upper page data is to become data 0, then the threshold voltage of the storage element will be raised so that the storage element is in state C. The process depicted by FIGS. 17*a-c* reduces the effect of floating gate to floating gate coupling because only the upper page programming of neighbor storage elements will have an effect on the apparent threshold voltage of a given storage element. An example of an alternate state coding is to move from distribution 1750 to state C when the upper page data is a 1, and to move to state B when the upper page data is a 0.

Although FIGS. 17*a-c* provide an example with respect to four data states and two pages of data, the concepts taught can be applied to other implementations with more or fewer than four states and more or less than two pages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:

reading at least one bit line-adjacent storage element of a selected storage element to ascertain a data state of the at least one bit line-adjacent storage element, the at least one bit line-adjacent storage element and the selected storage element are associated with respective different adjacent bit lines; and reading the selected storage element to ascertain a data state of the selected storage element, including applying different control gate read voltages, one at a time, to the selected storage element while setting voltages of the respective bit line of the at least one bit line-adjacent storage element based on its ascertained data state and the control gate read voltages.

2. The method of claim 1, wherein:

for each control gate read voltage, the voltage of the respective bit line of the at least one bit line-adjacent storage element is set according to a difference between the ascertained data state and a data state associated with the control gate read voltage, such that the voltage of the respective bit line of the at least one bit line-adjacent storage element is higher when the difference is greater.

3. The method of claim 1, wherein:
the reading at least one bit line-adjacent storage element occurs as part of a first step of a multi-step read operation; and
the reading the selected storage element occurs as part of a second step of the multi-step read operation.

4. The method of claim 3, wherein:
the multi-step read operation is an odd-even read operation in which storage elements associated with odd-numbered bit lines are read separately from storage elements associated with even-numbered bit lines.

5. The method of claim 1, wherein:
there are $2^N$ possible data states for the selected storage element, where $N \geq 2$;
for one of the control gate read voltages which is associated with a lowest data state of the $2^N$ possible data states, the voltage of the respective bit line of the at least one bit line-adjacent storage element is adjusted to one of $2^N$ available levels; and
for one of the control gate read voltages which is associated with a next higher data state of the $2^N$ possible data states, the voltage of the respective bit line of the at least one bit line-adjacent storage element is adjusted to one of $2^N-1$ available levels.

6. The method of claim 1, wherein:
there are $2^N$ possible data states for the selected storage element, where $N \geq 2$, and the voltage of the respective bit line of the at least one bit line-adjacent storage element is adjusted to one of more than $2^N$ available levels.

7. The method of claim 1, wherein:
the at least one bit line-adjacent storage element and the selected storage element are arranged along a common word line.

8. The method of claim 1, wherein:
the selected storage element is arranged along a selected word line, and the at least one bit line-adjacent storage element is arranged diagonally along an adjacent word line of the selected word line.

9. The method of claim 1, wherein:
different voltages are set on the respective bit line of the at least one bit line-adjacent storage element when corresponding different control gate read voltages are applied to the selected storage element.

10. The method of claim 1, wherein:
the different control gate read voltages include only one control gate read voltage for distinguishing between pairs of adjacent data states.

11. The method of claim 1, wherein:
the at least one bit line-adjacent storage element is an unselected storage element.

12. A non-volatile storage system which performs the method of claim 1.

13. A method for operating non-volatile storage, comprising:
as part of a first step of a multi-step read operation, reading a plurality of storage elements to ascertain their data states, the plurality of storage elements are associated with a plurality of adjacent bit lines; and
as part of a second step of the multi-step read operation, again reading the plurality of storage elements to again ascertain their data states, the again reading includes: (a) applying different control gate read voltages, one after another, to the plurality of storage elements, and (b) setting voltages on the plurality of bit lines based on the ascertained data states of the first step and based on the control gate read voltages.

14. The method of claim 13, wherein:
for each control gate read voltage, the setting voltages comprises setting a voltage of each bit line according to whether or not the ascertained data state of the associated storage element from the first step corresponds to a data state associated with the control gate read voltage.

15. The method of claim 13, further comprising:
for each bit line, the set voltage is independent of the ascertained data state of the associated storage element from the first step when the data state associated with the control gate read voltage corresponds to the ascertained data state of the associated storage element from the first step, and the set voltage is dependent on the ascertained data state of the associated storage element from the first step when the data state associated with the control gate read voltage does not correspond to the ascertained data state of the associated storage element from the first step.

16. The method of claim 13, wherein:
the multi-step read operation is an all bit line read operation.

17. A non-volatile storage system which performs the method of claim 13.

18. A method for operating non-volatile storage, comprising:
reading storage elements on an adjacent word line of a selected word line to ascertain their data states, including reading a word-line adjacent storage element of a selected storage element, the selected storage element is associated with the selected word line and the word-line adjacent storage element is associated with a word line which is adjacent to the selected word line;
reading at least one bit line-adjacent storage element of the selected storage element, the at least one bit line-adjacent storage element is associated with a bit line which is adjacent to a bit line with which the selected storage element is associated; and
reading the selected storage element to ascertain its data state, while compensating for coupling to the selected storage element from the word line-adjacent storage element, responsive to the reading of the word line-adjacent storage element, and while compensating for coupling to the selected storage element from the at least one bit line-adjacent storage element, responsive to the reading of the at least one bit line-adjacent storage element.

19. The method of claim 18, wherein:
the compensating for coupling to the selected storage element from the at least one bit line-adjacent storage element comprises adjusting a voltage of a respective bit line of the at least one bit line-adjacent storage element based on its ascertained data state.

20. The method of claim 18, wherein:
the compensating for coupling to the selected storage element from the word line-adjacent storage element comprises applying a series of read pass voltages to the adjacent word line while applying each voltage of a plurality of control gate read voltages to the selected word line, and sensing the selected storage element when an identified one of the read pass voltages is applied, the identified one of the read pass voltages is based on the ascertained data state of the word line-adjacent storage element.

21. The method of claim 18, wherein:
the adjacent word line is after the selected word line in a programming order.

22. The method of claim 18, wherein:
the at least one bit line-adjacent storage element is arranged on the selected word line.

23. The method of claim 18, wherein:
the at least one bit line-adjacent storage element is arranged diagonally on the adjacent word line.

24. The method of claim 18, wherein:
the word-line adjacent storage element and the at least one bit line-adjacent storage element are unselected storage elements.

25. A non-volatile storage system which performs the method of claim 18.

* * * * *